United States Patent
Peng et al.

(10) Patent No.: US 11,621,343 B2
(45) Date of Patent: Apr. 4, 2023

(54) METHOD OF MANUFACTURING SEMICONDUCTOR DEVICES AND SEMICONDUCTOR DEVICES

(71) Applicant: TAIWAN SEMICONDUCTOR MANUFACTURING COMPANY, LTD., Hsinchu (TW)

(72) Inventors: Cheng-Yi Peng, Taipei (TW); Wen-Yuan Chen, Yangmei (TW); Wen-Hsing Hsieh, Hsinchu (TW); Yi-Ju Hsu, Zhudong Township (TW); Jon-Hsu Ho, New Taipei (TW); Song-Bor Lee, Zhubei (TW); Bor-Zen Tien, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 77 days.

(21) Appl. No.: 17/379,551

(22) Filed: Jul. 19, 2021

(65) Prior Publication Data
US 2021/0351282 A1 Nov. 11, 2021

Related U.S. Application Data

(62) Division of application No. 16/601,721, filed on Oct. 15, 2019, now Pat. No. 11,069,791.
(Continued)

(51) Int. Cl.
*H01L 29/66* (2006.01)
*H01L 21/8234* (2006.01)
(Continued)

(52) U.S. Cl.
CPC .... *H01L 29/66545* (2013.01); *H01L 21/0214* (2013.01); *H01L 21/02164* (2013.01);
(Continued)

(58) Field of Classification Search
CPC ....... H01L 29/66545; H01L 21/823431; H01L 27/0886
See application file for complete search history.

(56) References Cited

U.S. PATENT DOCUMENTS 9,076,870 B2  7/2015  Lin et al.
9,472,651 B2  10/2016  Leobandung
(Continued)

FOREIGN PATENT DOCUMENTS

CN    105789306 A    7/2016
CN    107452739 A    12/2017
(Continued)

OTHER PUBLICATIONS

Notice of Allowance issued in U.S. Appl. No. 16/601,721, dated Jun. 21, 2021.

*Primary Examiner* — Anthony Ho
(74) *Attorney, Agent, or Firm* — McDermott Will & Emery LLP

(57) ABSTRACT

A method of manufacturing a semiconductor device, a plurality of fin structures are formed over a semiconductor substrate. The fin structures extend along a first direction and are arranged in a second direction crossing the first direction. A plurality of sacrificial gate structures extending in the second direction are formed over the fin structures. An interlayer dielectric layer is formed over the plurality of fin structures between adjacent sacrificial gate structures. The sacrificial gate structures are cut into a plurality of pieces of sacrificial gate structures by forming gate end spaces along the second direction. Gate separation plugs are formed by filling the gate end spaces with two or more dielectric materials. The two or more dielectric materials includes a first layer and a second layer formed on the first layer, and
(Continued)

a dielectric constant of the second layer is smaller than a dielectric constant of the first layer.

20 Claims, 25 Drawing Sheets

Related U.S. Application Data

(60) Provisional application No. 62/753,888, filed on Oct. 31, 2018.

(51) Int. Cl.
*H01L 27/088* (2006.01)
*H01L 21/02* (2006.01)

(52) U.S. Cl.
CPC .......... *H01L 21/02203* (2013.01); *H01L 21/823431* (2013.01); *H01L 21/823437* (2013.01); *H01L 21/823468* (2013.01); *H01L 27/0886* (2013.01)

(56) References Cited

U.S. PATENT DOCUMENTS

| | | |
|---|---|---|
| 9,659,930 B1 | 5/2017 | Yu et al. |
| 9,929,242 B2 | 3/2018 | Chang et al. |
| 10,269,802 B2 | 4/2019 | Lin |
| 10,490,552 B2 | 11/2019 | Lee et al. |
| 2016/0111336 A1 | 4/2016 | Chang et al. |
| 2016/0351568 A1 | 12/2016 | Chang et al. |
| 2017/0345820 A1 | 11/2017 | Lin et al. |
| 2018/0337266 A1 | 11/2018 | Ohtou et al. |

FOREIGN PATENT DOCUMENTS

| | | |
|---|---|---|
| KR | 20160115904 A | 10/2016 |
| KR | 10-2016-0134442 A | 11/2016 |
| KR | 20160140321 A | 12/2016 |
| KR | 10-2017-0095174 A | 8/2017 |
| KR | 20180113887 A | 10/2018 |
| TW | I620314 B | 4/2018 |
| TW | I629717 B | 7/2018 |
| TW | I631612 B | 8/2018 |

000
METHOD OF MANUFACTURING SEMICONDUCTOR DEVICES AND SEMICONDUCTOR DEVICES

RELATED APPLICATIONS

This application is a divisional of U.S. patent application Ser. No. 16/601,721 filed Oct. 15, 2019, now U.S. Pat. No. 11,069,791, which claims priority to U.S. Provisional Patent Application No. 62/753,888 filed Oct. 31, 2018, the entire contents of each of which are incorporated herein by reference.

BACKGROUND

In current technology, performing gate end cuts and refilling the cut spaces with silicon nitride introduce an increase in extrinsic capacitance because $Si_3N_4$ has a larger dielectric constant. Moreover, the end cut process before dummy gate removal constrains the dummy poly/oxide removal and the interfacial layer (IL), high-k dielectric (HK), metal gate (MG) refill window.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 1A is an isometric view and FIG. 1B is a cross sectional view.

FIG. 2A is an isometric view and FIGS. 2B and 2C are cross sectional views.

FIG. 3A is an isometric view and FIG. 3B is a cross sectional view.

FIG. 4A is an isometric view and FIG. 4B is a cross sectional view.

FIG. 5A is an isometric view and FIG. 5B is a cross sectional view. FIGS. 5C and 5D are detailed cross-sectional views.

FIG. 6A is an isometric view and FIG. 6B is a cross sectional view. FIG. 6C is a detailed cross-sectional view.

FIG. 7A is an isometric view and FIG. 7B is a cross sectional view. FIGS. 7C-7E are detailed cross-sectional views.

FIG. 8A is an isometric view and FIG. 8B is a cross sectional view.

FIG. 9A is an isometric view and FIG. 9B is a cross sectional view.

FIG. 10A is an isometric view and FIG. 10B is a cross sectional view.

FIG. 11A is an isometric view and FIG. 11B is a cross sectional view.

FIG. 12A is an isometric view and FIG. 12B is a cross sectional view.

FIG. 13A is an isometric view and FIG. 13B is a cross sectional view.

FIG. 14A is an isometric view and FIGS. 14B, 14C and 14E are cross sectional views. FIG. 14D is a detailed cross section. FIGS. 14F and 14G are cross sectional views of other embodiments.

DETAILED DESCRIPTION

Figure 1B:
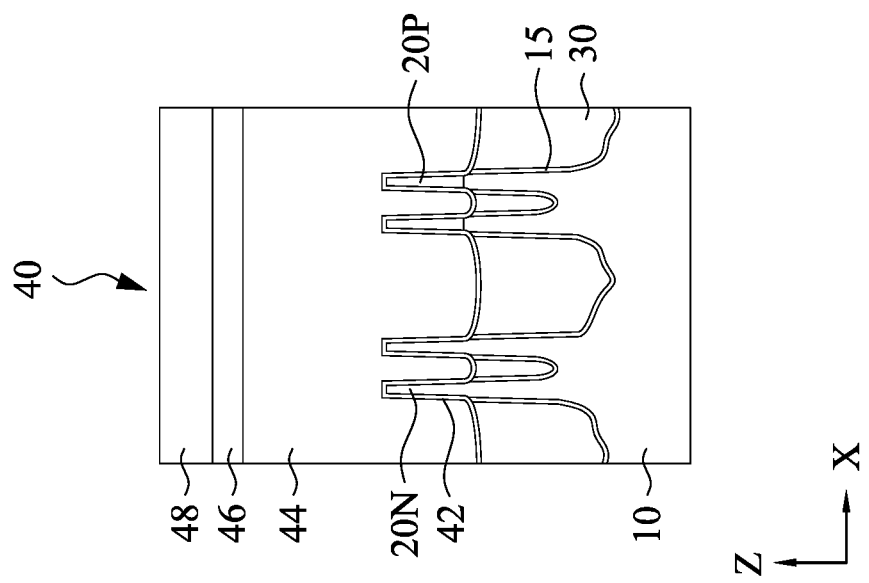
FIGS. 1A and 1B are schematic illustrations of a sequential step of manufacturing a semiconductor device according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of" In the present disclosure, a phrase "one of A, B and C" means "A, B and/or C" (A, B, C, A and B, A and C, B and C, or A, B and C), and does not mean one element from A, one element from B and one element from C, unless otherwise described.

Disclosed embodiments relate to a semiconductor device, in particular, a complementary metal-oxide-semiconductor field effect transistor (CMOS FET), for example, a fin field effect transistor (FinFET) and its manufacturing method. The embodiments such as those disclosed herein are generally applicable not only to FinFETs but also to a planar FET, a double-gate FET, a surround-gate FET, an omega-gate FET or gate-all-around (GAA) FET, and/or a nanowire FET, or any suitable device having a three-dimensional channel structure. In some embodiments of the present disclosure, metal gates are separated along their extending direction by a gate separation plug.

In embodiments of the present disclosure, the gate separation plug (also called as an end cut isolation layer/material) includes one or more layers of materials with a lower dielectric constant than $Si_3N_4$, such as $SiO_2$, carbon-doped $Si_3N_4$(c-$Si_3N_4$), porous low-k material, SiCN, SiOC, SiOCN or an organic material. In some embodiments of the disclosure, the gate separation plug is a single layer made of one of $SiO_2$, SiOCN, SiOC or porous low-k material. In other embodiments, the gate separation plug is a bilayer, such as SiOCN on $SiO_2$, SiOCN on or under porous low-k material. In other embodiments, the gate separation plug is a trilayer structure, such as $SiO_2$ on SiOCN on $SiO_2$, $SiO_2$ on porous low-k material on $SiO_2$, porous low-k on SiOCN on $SiO_2$, or SiOCN on porous low-k material on $SiO_2$. A low-k material generally has a dielectric constant smaller than silicon dioxide (3.9). A porous low-k material generally has a dielectric constant smaller than 2.0.

Embodiments of the disclosure provide a reduced cell extrinsic capacitance from the end cut isolation. A simulation demonstrates an extrinsic capacitance reduction of 1.3-1.5% compared to a gate separation plug refilled with $Si_3N_4$. Thus, a circuit/chip performance boost is expected.

In an end cut before dummy gate removal, the first silicon dioxide inserted layer helps enlarge the process window of dummy poly/oxide removal steps in some embodiments.

FIGS. 1A-7E show various stages of a sequential manufacturing operation of a semiconductor device according to an embodiment of the present disclosure. It is understood that additional operations can be provided before, during, and after the operations of FIGS. 1A-7E, and some of the operations described below can be replaced or eliminated for additional embodiments of the method. The order of the operations/processes may be interchangeable.

Figure 1A:
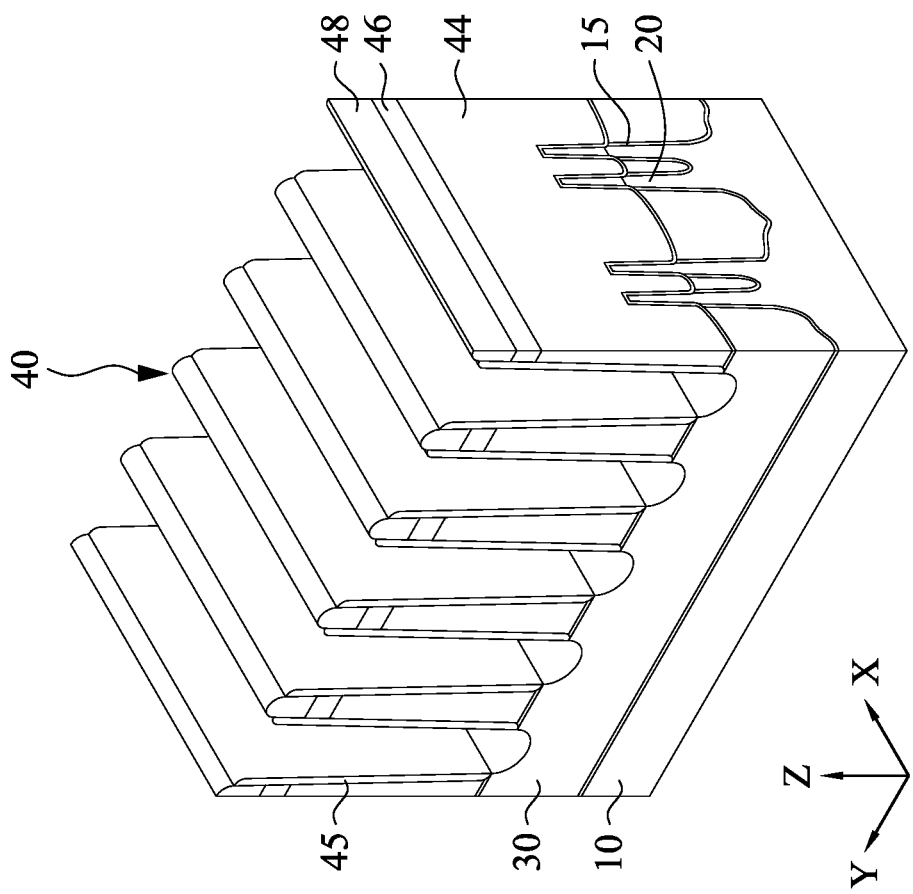

FIGS. 1A and 1B are schematic illustrations of a sequential step of manufacturing a semiconductor device according to an embodiment of the present disclosure. FIG. 1A is an isometric view and FIG. 1B is a cross sectional view.

FIGS. 1A and 1B show the structure after dummy gate structures 40 with gate sidewall spacers 45 are formed over fin structures 20 disposed over a substrate 10. To fabricate fin structures 20, a mask layer is formed over the substrate 10 (e.g., a semiconductor wafer) by, for example, a thermal oxidation process and/or a chemical vapor deposition (CVD) process. The substrate is, for example, a p-type silicon substrate with an impurity concentration in a range from about $1\times10^{15}$ cm$^{-3}$ and about $5\times10^{15}$ cm$^{-3}$. In other embodiments, The substrate is an n-type silicon substrate with an impurity concentration in a range from about $1\times10^{15}$ cm$^{-3}$ and about $5\times10^{15}$ cm$^{-3}$. Alternatively, the substrate 10 may comprise another elementary semiconductor, such as germanium; a compound semiconductor including Group IV-IV compound semiconductors such as SiC and SiGe, Group III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate 10 is a silicon layer of an SOI (silicon-on insulator) substrate. In some embodiments, a part of the substrate includes an epitaxial semiconductor layer having a different lattice constant than the substrate 10. In some embodiments, the substrate 10 is made of Si and the epitaxial semiconductor layer is made of SiGe. The epitaxial semiconductor layer is formed in a trench or a recess formed in the substrate 10 and the upper surface of the epitaxial semiconductor layer and the upper surface of the Si substrate are coplanar in some embodiments.

By using one or more lithography and etching operations, the substrate 10 with the epitaxial layer is patterned into the fin structures. In some embodiments of the present disclosure, the fin structures 20 are formed by patterning using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. In some embodiments of the present disclosure, the photolithographic method includes ultraviolet (UV) photolithography, deep ultraviolet (DUV) photolithography, and extreme ultraviolet (EUV) photolithography.

In some embodiments, the fin structures 20 includes n-type fin structures 20N for n-type FETs and p-type fin structures 20P for p-type FETs. In some embodiments, the n-type fin structures 20N are made of the same material as the substrate 10 (e.g., Si) and the p-type fin structures 20P are made of a different material (e.g., $Si_{1-x}Ge_x$, where $0.2<x<0.6$ in some embodiments) than the substrate 10. In some embodiments, one or more dummy fin structures (not shown) are formed on both sides of the fin structures 20 to improve pattern fidelity in the patterning operations.

After the fin structures 20 are formed, an insulating material layer including one or more layers of insulating material is formed over the substrate 10 so that the fin structures 20 are fully embedded in the insulating material layer. The insulating material for the isolation insulating layer 30 is made of, for example, silicon dioxide formed by LPCVD (low pressure chemical vapor deposition), plasma-CVD or flowable CVD. In the flowable CVD, flowable dielectric materials instead of silicon oxide are deposited. Flowable dielectric materials, as their name suggest, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydro-polysilazane (PSZ), a tetraethyl ortho-silicate (TEOS), or a silyl-amine, such as trisilylamine (TSA). These flowable silicon oxide materials are formed in a multiple-operation process. After the flowable film is deposited, it is cured and then annealed to remove undesired element(s) to form silicon oxide. When the undesired element(s) is removed, the flowable film densifies and shrinks. In some embodiments, multiple anneal processes are conducted. The flowable film is cured and annealed more than once. The isolation insulating layer 30 may be SOG, SiO, SiON, SiOCN or fluorine-doped silicate glass (FSG). The isolation insulating layer 30 may be doped with boron and/or phosphorous. Then, a planarization operation, such as a chemical mechanical polishing (CMP) method and/or an etch-back method, is performed such that the upper surface of the fin structures 20 is exposed from the insulating material layer. In some embodiments, a fin liner layer 15 is formed over the fin structures 20 before forming the insulating material layer. The fin liner layer 15 includes one or more layers of silicon nitride, silicon oxide, SiON, SiOCN, aluminum oxide, AlOC, or any other suitable insulating material. Then, the insulating material layer is recessed to form an isolation insulating layer (also called shallow trench isolation (STI)) so that the upper portions of the fin structures 20 are exposed. The fin liner layer 15 formed on the upper portion of the fin structures 20 is removed during or after the recessing the insulating material layer.

After the isolation insulating layer 30 is formed, a sacrificial gate dielectric layer 42 is formed on the upper portions of the fin structures (channel regions 20N and 20P) and the upper surface of the isolation insulating layer 30. The sacrificial gate dielectric layer 42 includes one or more layers of insulating material. In some embodiments, $SiO_2$ is used. In one embodiment, silicon oxide is formed by chemical vapor deposition (CVD), including low pressure CVD (LPCVD) and plasma enhanced CVD (PECVD), physical vapor deposition (PVD), atomic layer deposition (ALD), or other suitable process. The thickness of the sacrificial gate dielectric layer 42 is in a range from about 1 nm to about 5 nm in some embodiments of the present disclosure. Further, a sacrificial gate electrode layer 44 is formed over the sacrificial gate dielectric layer 42, and then first and second hard mask layers 46 and 48 are formed over the sacrificial gate electrode layer 44. In some embodiments, the sacrificial gate electrode layer 44 is made of poly silicon or amorphous silicon.

Then, by using one or more lithography and etching operations, the sacrificial gate electrode layer (poly silicon layer) is patterned so as to obtain sacrificial gate structures 40, as shown in FIGS. 1A and 1B. After the patterning the poly silicon layer, gate sidewall spacers 45 are formed at both side faces of the sacrificial gate structures 40, as shown in FIGS. 1A and 1B. The gate sidewall spacers 45 are is made of one or more layers of silicon oxide or silicon nitride based materials such as silicon oxide, SiN, SiCN, SiON or SiOCN, or aluminum based insulating material. In one embodiment, multiple layers are used. In some embodiments, the gate sidewall spacers 45 have thickness of about 2 nm to about 8 nm.

Figure 2B:
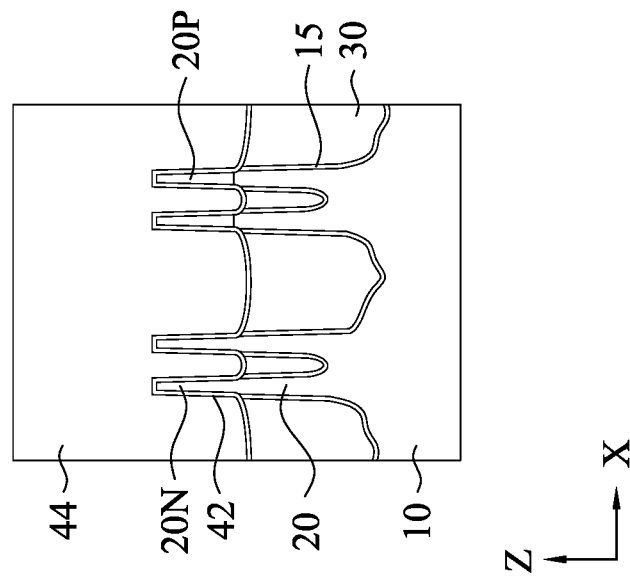
FIGS. 2A, 2B and 2C are schematic illustrations of a sequential step of manufacturing a semiconductor device according to an embodiment of the present disclosure.
Figure 2A:
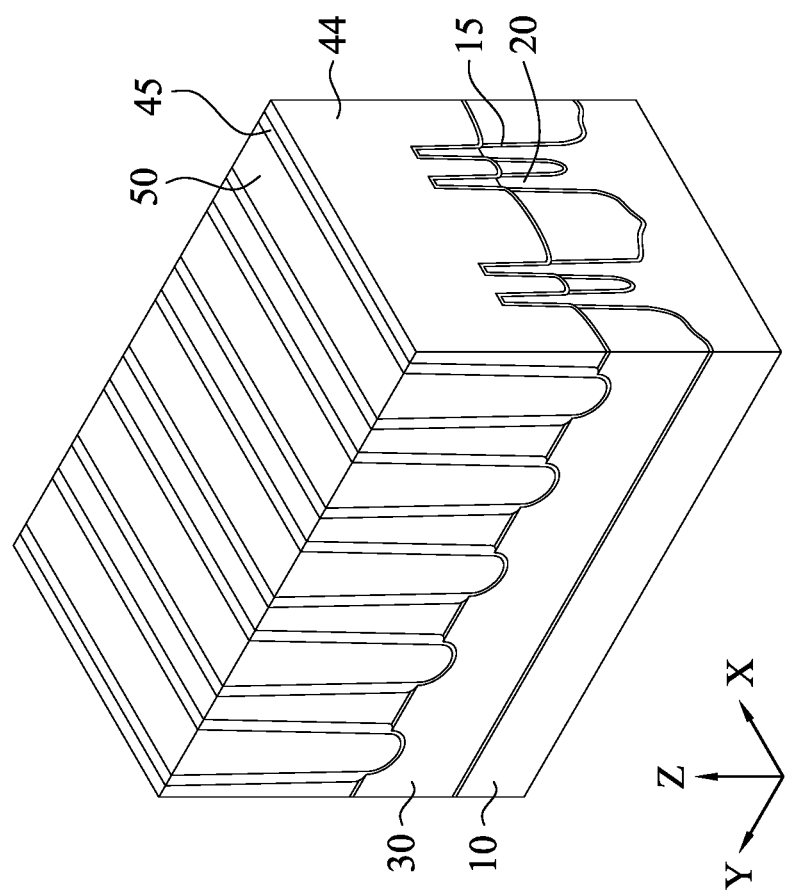
Figure 2C:
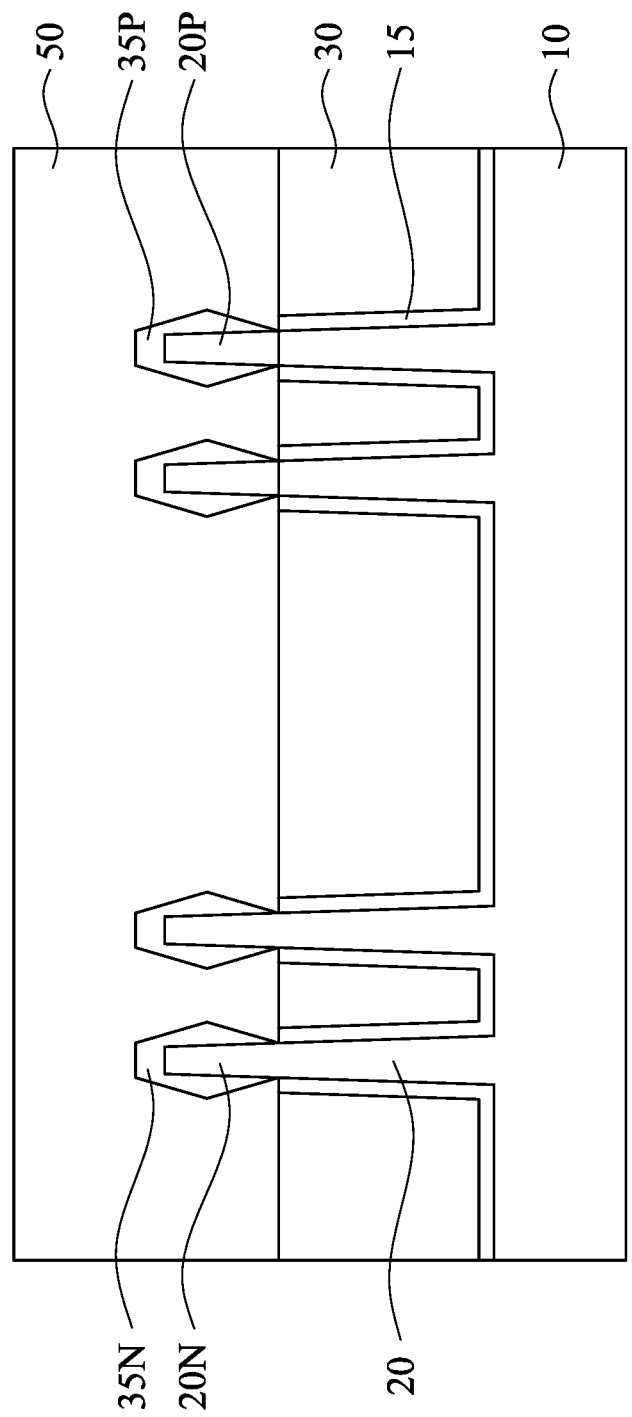

FIGS. 2A-2C are schematic illustrations of a sequential step of manufacturing a semiconductor device according to an embodiment of the present disclosure. FIG. 2A is an isometric view and FIG. 2B is a cross sectional view cutting the sacrificial gate structure 40 and FIG. 2C is a cross sectional view cutting the source/drain regions.

After the sacrificial gate structures 40 with the gate sidewall spacers 45 are formed, one or more source/drain epitaxial layers 35N and 35P are formed over source/drain regions of the fin structures. In some embodiments, the source/drain epitaxial layer 35N, 35P is individually formed over the fin structures 20N, 20P, respectively, without merging the adjacent source/drain epitaxial layer. In other embodiments, the adjacent source/drain epitaxial layers 35N (and/or 35P) are merged to form a merged epitaxial layer.

The materials used for the source/drain epitaxial layer may be varied for the n-type and p-type FinFETs, such that one type of material is used for the n-type FinFETs to exert a tensile stress in the channel region and another type of material for the p-type FinFETs to exert a compressive stress. For example, SiP or SiC may be used to form the epitaxial layer 35N, and SiGe or Ge may be used to form the epitaxial layer 35P. In some embodiments, boron (B) is doped in the source/drain epitaxial layer 35P for the p-type FinFETs. Other materials can be used. In some embodiments, the source/drain epitaxial layer includes two or more epitaxial layers with different compositions and/or different dopant concentrations. The source/drain epitaxial layer can be formed by CVD, ALD, molecular beam epitaxy (MBE), or any other suitable methods.

In some embodiments, the source/drain regions of the fin structures 20 are recessed down below the upper surface of the isolation insulating layer 30, and then the epitaxial layer is formed on the recessed fin structures.

After the source/drain epitaxial layers 35N, 35P are formed, a first interlayer dielectric (ILD) layer 50 is formed. In some embodiments, before forming the first ILD layer 50, an etch stop layer (ESL) is formed over the source/drain epitaxial layers and the gate sidewall spacers 45. The ESL is made of silicon nitride or a silicon nitride-based material (e.g., SiON, SiCN or SiOCN). The materials for the first ILD layer 50 include compounds comprising Si, O, C and/or H, such as silicon oxide, SiCOH and SiOC. Organic materials, such as polymers, may be used for the first ILD layer 50. In some embodiments, after the first ILD layer 50 is formed, a planarization operation, such as an etch-back process and/or a chemical mechanical polishing (CMP) process, is performed to expose the upper surface of the sacrificial gate electrode layers 44, as shown in FIGS. 2A and 2B.

Figure 3B:
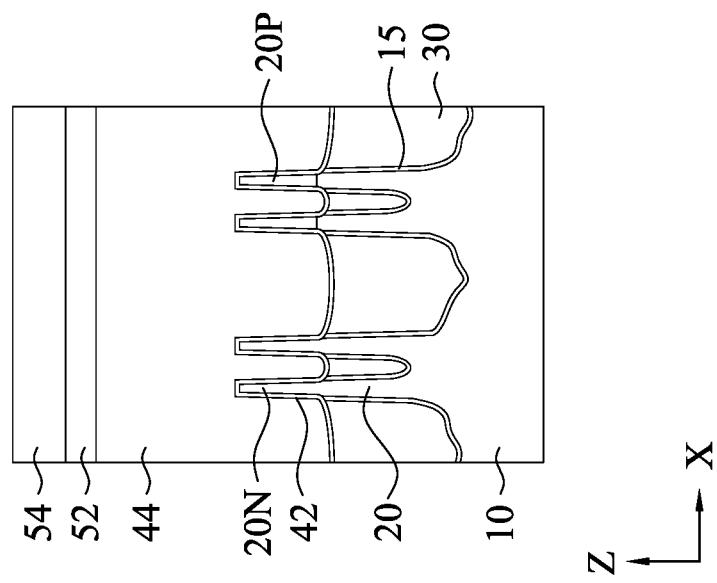
FIGS. 3A and 3B are schematic illustrations of a sequential step of manufacturing a semiconductor device according to an embodiment of the present disclosure.
Figure 3A:
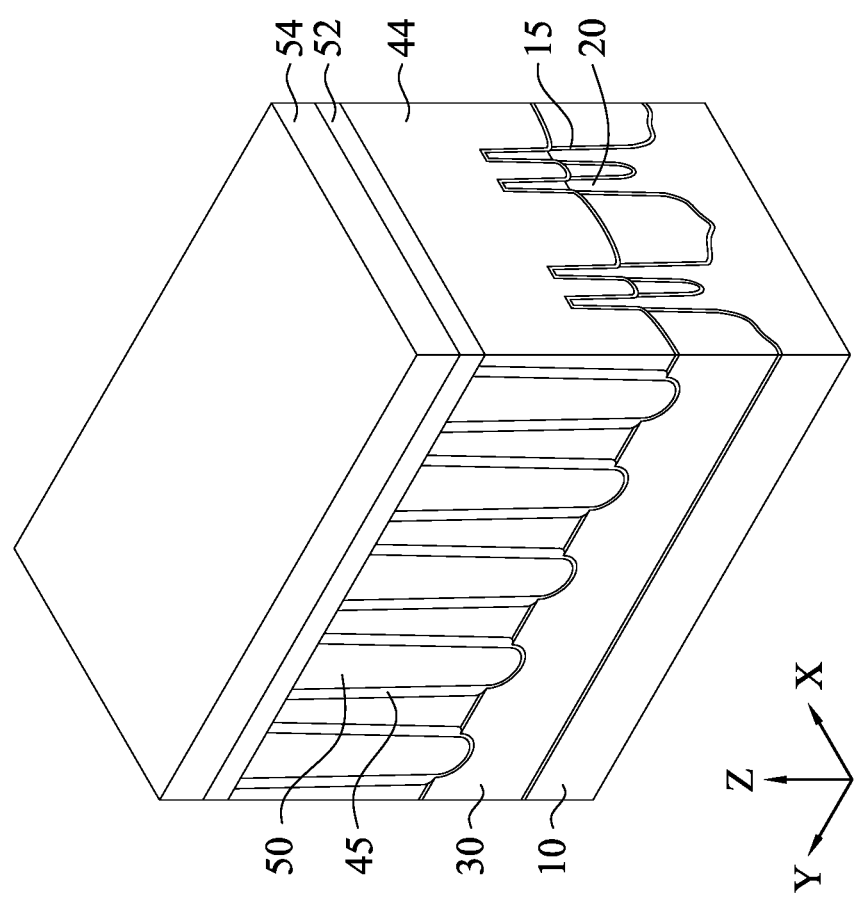

FIGS. 3A and 3B are schematic illustrations of a sequential step of manufacturing a semiconductor device according to an embodiment of the present disclosure. FIG. 3A is an isometric view and FIG. 3B is a cross sectional view cutting the sacrificial gate electrode layer 44.

As shown in FIGS. 3A and 3B, one or more hard mask layers are formed over the sacrificial gate electrode layers 44, and the first ILD layer 50. In some embodiments, the hard mask layer includes a first hard mask layer 52 and a second hard mask layer 54 made of different materials from each other. In some embodiments, the first hard mask layer 52 is made of silicon oxide and the second hard mask layer 54 is made of silicon nitride or SiON.

Figure 4B:
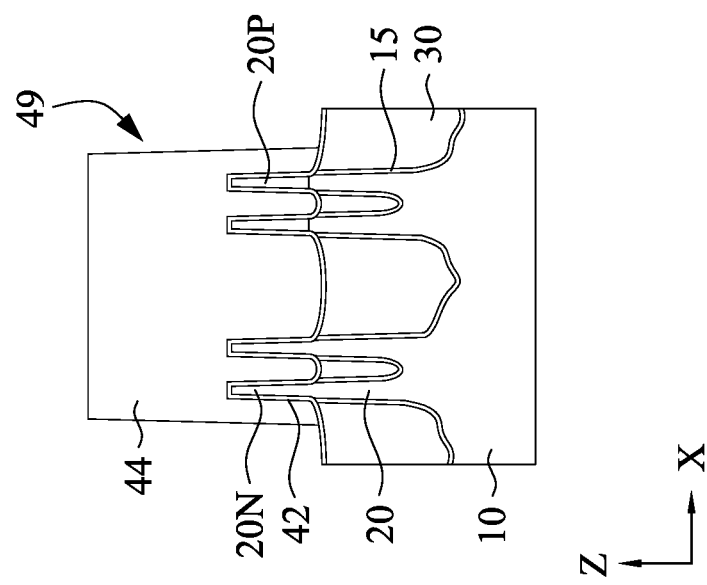
FIGS. 4A and 4B are schematic illustrations of a sequential step of manufacturing a semiconductor device according to an embodiment of the present disclosure.
Figure 4A:
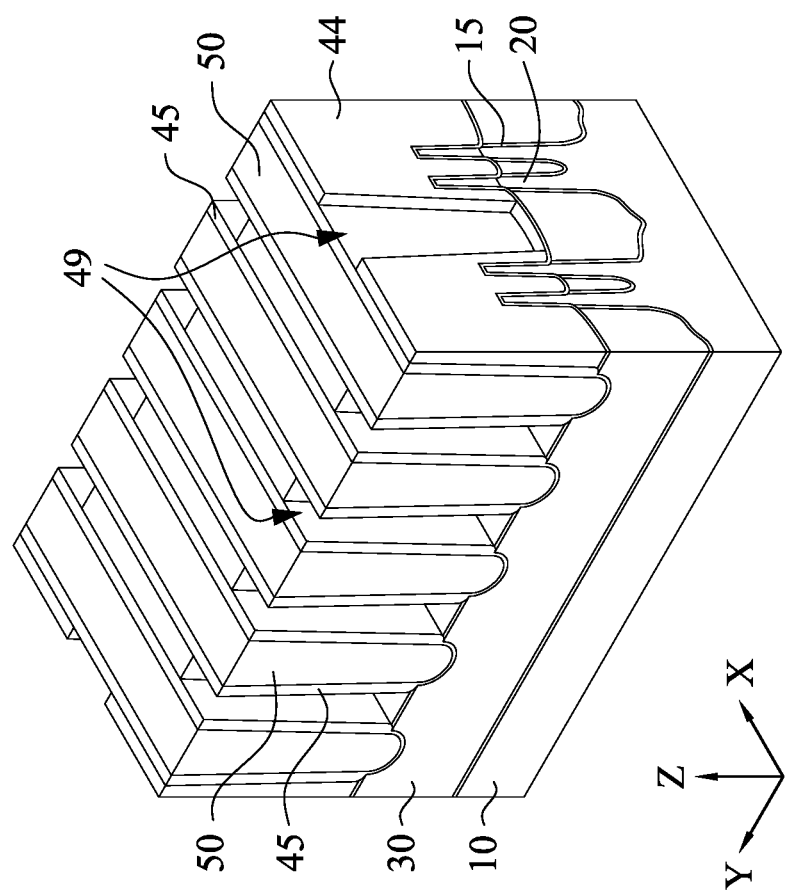

FIGS. 4A and 4B are schematic illustrations of a sequential step of manufacturing a semiconductor device according to an embodiment of the present disclosure. FIG. 4A is an isometric view and FIG. 4B is a cross sectional view cutting the sacrificial gate electrode layer 44.

The sacrificial gate structures extending in the X direction are cut into a plurality pieces of sacrificial gate structures by an end cut process. The end cut process includes one or more lithography and etching operations. By the end cut process, one or more gate end spaces 49 are formed as shown in FIGS. 4A and 4B. In some embodiments, the sacrificial gate dielectric layer 42 remains in the bottom of the gate end space 49. In other embodiments, the sacrificial gate dielectric layer 42 is fully removed from the gate end space 49 and remains under the sacrificial gate electrode layer 44 and the gate sidewall spacers 45.

In some embodiments, a photo resist layer having openings are formed over the hard mask layers. In some embodiments, at least one opening is located over two or more sacrificial gate electrode layers 44. By using the photo resist layer as an etching mask, the hard mask layers are patterned and then the sacrificial gate electrode layer 44 is patterned by using one or more patterned hard mask layers.

Figure 5B:
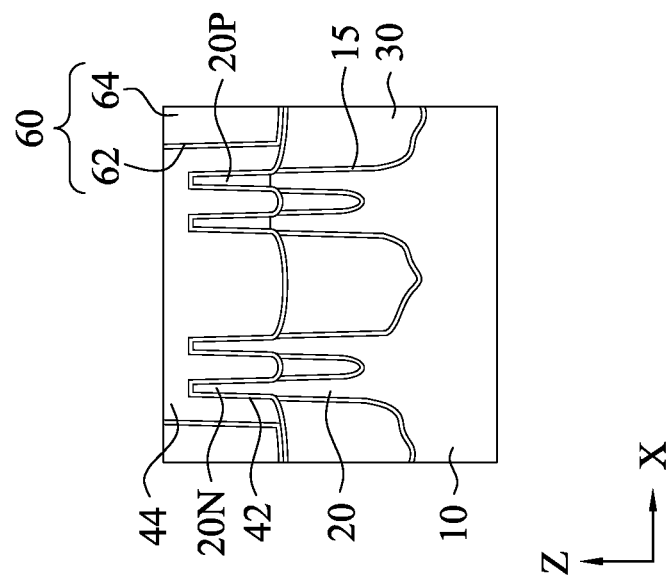
FIGS. 5A, 5B, 5C and 5D are schematic illustrations of a sequential step of manufacturing a semiconductor device according to an embodiment of the present disclosure.
Figure 5A:
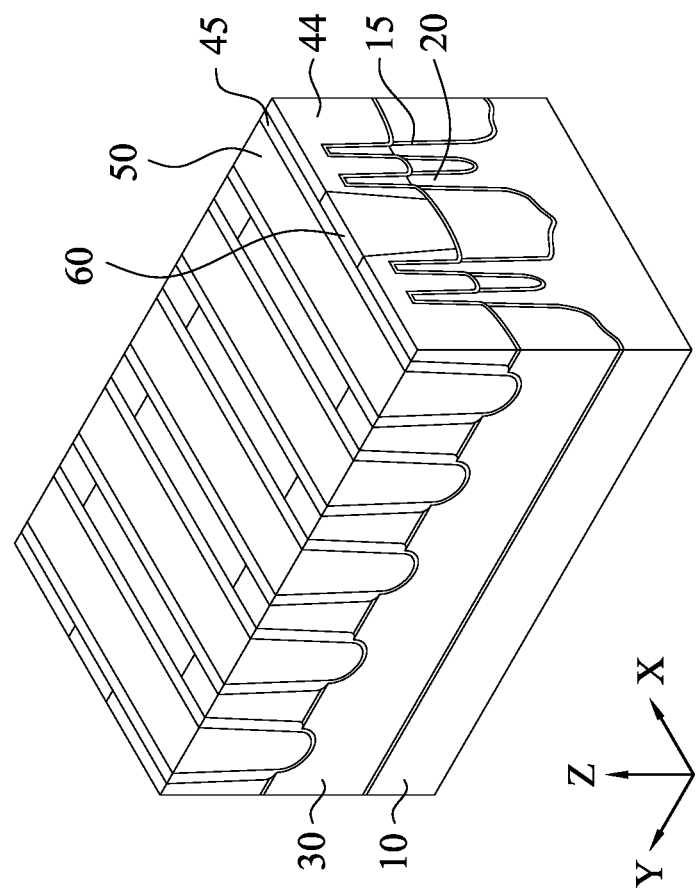
Figure 5D:
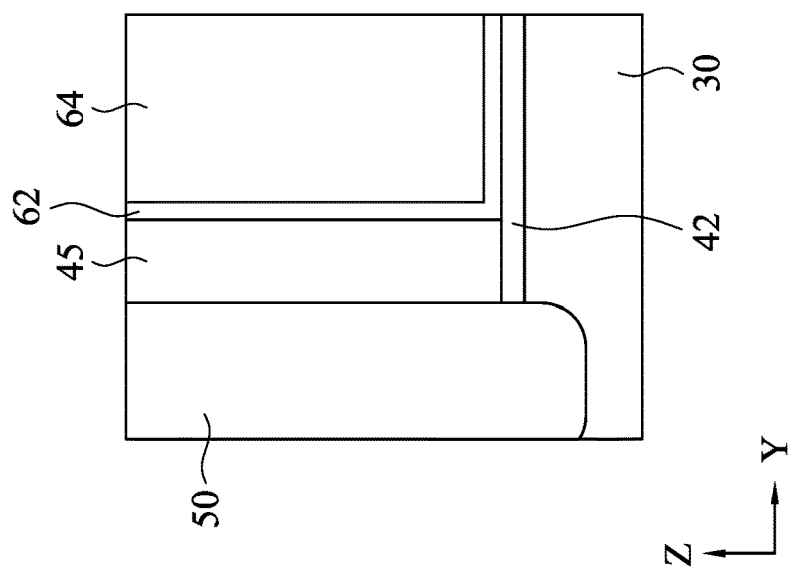
Figure 5C:
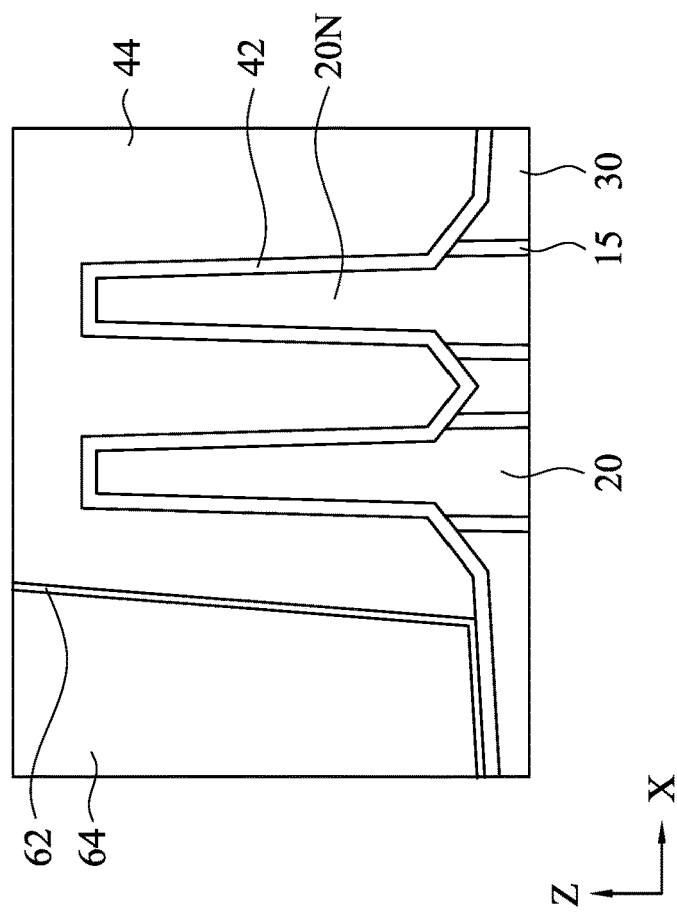

FIGS. 5A-5D are schematic illustrations of a sequential step of manufacturing a semiconductor device according to an embodiment of the present disclosure. FIG. 5A is an isometric view and FIG. 5B is a cross sectional view cutting the sacrificial gate electrode layer 44. FIGS. 5C and 5D are detailed cross-sectional views. FIG. 5C is a cross sectional view cutting the sacrificial gate electrode layer 44 in the X direction, and FIG. 5D is a cross sectional view cutting the separation plug 60 in the Y direction.

After the gate end spaces 49 are formed by the end cut process, the gate end spaces 49 are filled with one or more dielectric materials, and then a CMP operation is performed to form gate separation plugs 60 as shown in FIGS. 5A and 5B.

The gate separation plug is made of a dielectric material having a lower dielectric constant than silicon nitride, thereby obtaining a lower extrinsic capacitance.

In some embodiments, the gate separation plug includes one or more layers of materials with a lower dielectric constant, such as $SiO_2$, porous low-k material, SiCN, SiOC, SiOCN or an organic material. In some embodiments, the gate separation plug 60 is a single layer made of one of $SiO_2$, SiOCN, SiOC or porous low-k material. In other embodiments, the gate separation plug 60 includes a first layer 62 and a second layer 64. In some embodiments, the first layer 62 is made of a dielectric material having a higher dielectric constant than the second layer 64. In some embodiments, the thickness of the first layer 62 is smaller than the thickness of the second layer 64. In some embodiments, the thickness of the first layer 62 is in a range from about 0.5 nm to about 2 nm depending on the dimension of the gate end spaces 49. In some embodiments, the thickness of the second layer 64 is in a range from about 1 nm to about 5 nm depending on the dimension of the gate end spaces 49. In some embodiments, the first layer 62 is made of $SiO_2$ and the second layer 64 is made of one of SiOC, SiCN, SiOCN or porous low-k material. In other embodiments, the first layer 62 is made of SiOCN and the second layer 64 is made of one of SiOC, SiCN or porous low-k material. In other embodiments, the gate separation plug 60 includes three layers. In some embodiments, the gate separation plug 60 is a tri-layer of $SiO_2$ on SiOCN on $SiO_2$, $SiO_2$ on porous low-k material on $SiO_2$, porous low-k material on SiOCN on $SiO_2$, or SiOCN on porous low-k material on $SiO_2$. In some embodiments, the thickness of each layer of the tri-layer is in a range from about 0.5 nm to about 3 nm depending on the dimension of the gate end spaces 49.

In some embodiments, as shown in FIG. 5C, the first layer 62 is formed on the sacrificial gate dielectric layer 42 in the gate end space 40 and the second layer 64 is formed on the first layer 62. In some embodiments, as shown in FIG. 5D, the first layer 62 is formed on the sacrificial gate dielectric layer 42 which extends into the bottom of the gate sidewall spacer 45. In other words, one dielectric layer 42 is disposed between the gate sidewall 45 and the isolation insulating layer 30 and two dielectric layers 42 and 62 are disposed between the second layer 64 and the isolation insulating layer 30 (different numbers of dielectric layer(s)).

Figure 6B:
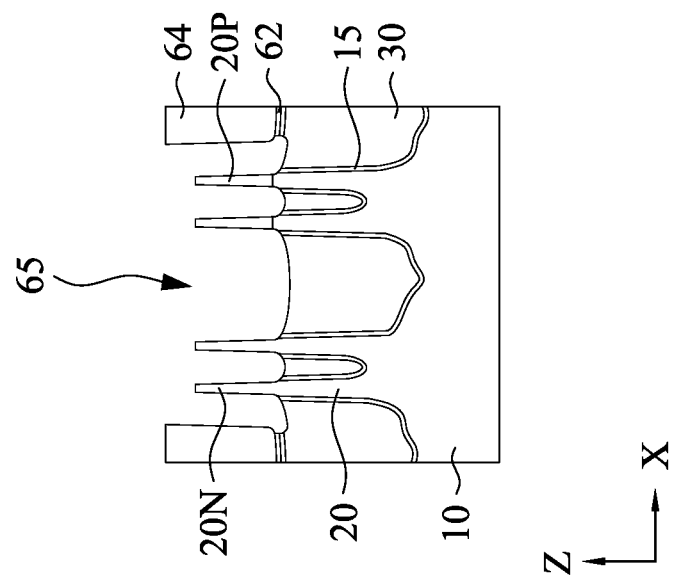
FIGS. 6A, 6B and 6C are schematic illustrations of a sequential step of manufacturing a semiconductor device according to an embodiment of the present disclosure.
Figure 6A:
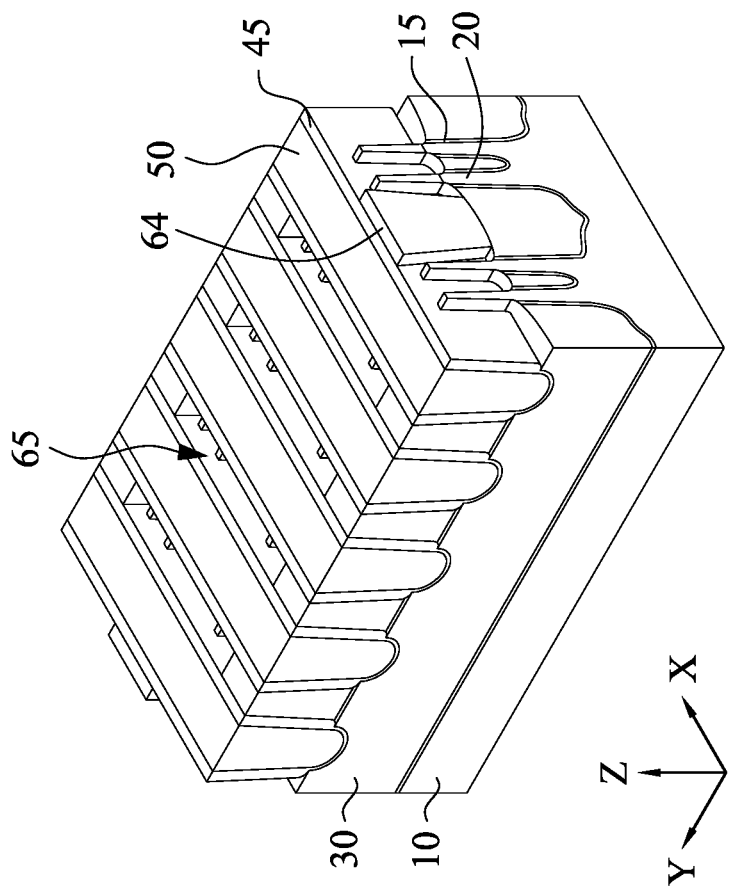
Figure 6C:
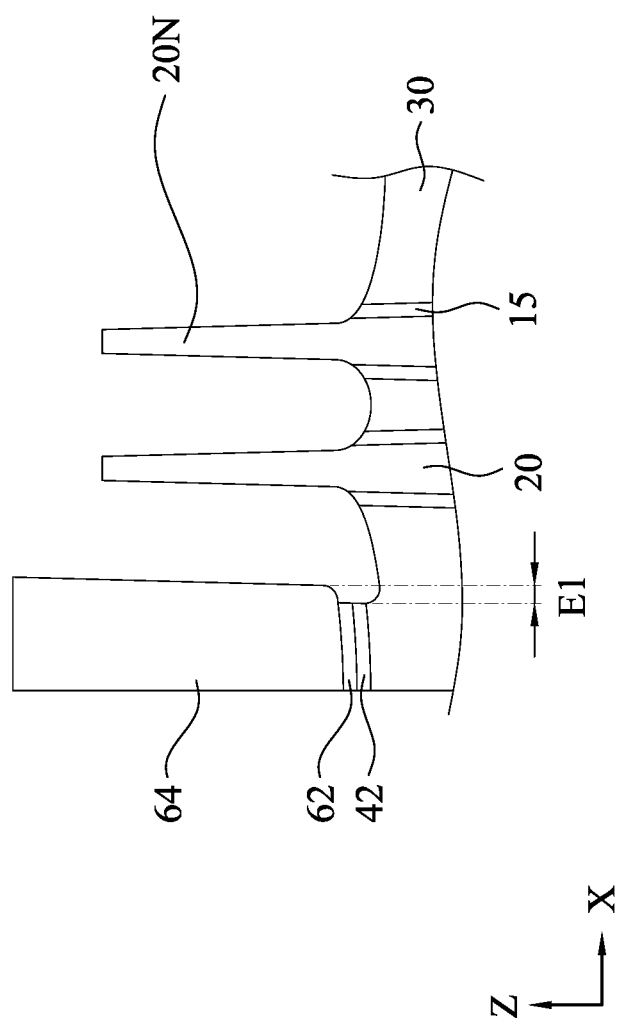

FIGS. 6A-6C are schematic illustrations of a sequential step of manufacturing a semiconductor device according to an embodiment of the present disclosure. FIG. 6A is an isometric view, FIG. 6B is a cross sectional view and FIG. 6C is a detailed cross sectional view.

The sacrificial gate structures 40 are subsequently removed by one or more appropriate etching operations to form gate spaces 65. When the sacrificial gate electrode layer 44 is polysilicon, a wet etchant such as a tetramethylammonium hydroxide (TMAH) solution can be used to selectively remove the sacrificial gate electrode layer 44. Further, the sacrificial gate dielectric layer 42 is thereafter removed using plasma dry etching and/or wet etching, thereby exposing the upper portion of the fin structures 20N, 20P, as shown in FIGS. 6A and 6B.

When the first layer 62 of the gate separation plug 60 is made of the same as or similar material to the sacrificial gate dielectric layer 42, the first layer 62 is also removed when removing the sacrificial gate dielectric layer. When the first layer 62 of the gate separation plug 60 is made of a different material than the sacrificial gate dielectric layer 42, an additional etching operation is performed to remove the first layer 62. By removing the first layer 62, it is possible to enlarge the gate space 65 in the X direction by the thickness of the first layer 62. When the gate space 65 is larger, it is easier to fill a gate dielectric layer and one or more conductive layers for a gate electrode in the gate space in a gate replacement process.

In some embodiments, as shown in FIG. 6C, the first layer 62 and the sacrificial gate dielectric layer 42 disposed under the second layer 64 of the gate separation plug 60 are partially removed and thus laterally recessed. In some embodiments, the lateral etching (recessing) amount E1 from a bottom edge of the second layer 64 is in a range from about 0.5 nm to about 2 nm. In some embodiments, the recessed amount E1 for the first layer 62 is larger or smaller (different) than the recessed amount E1 for the sacrificial gate dielectric layer 42.

Figure 7B:
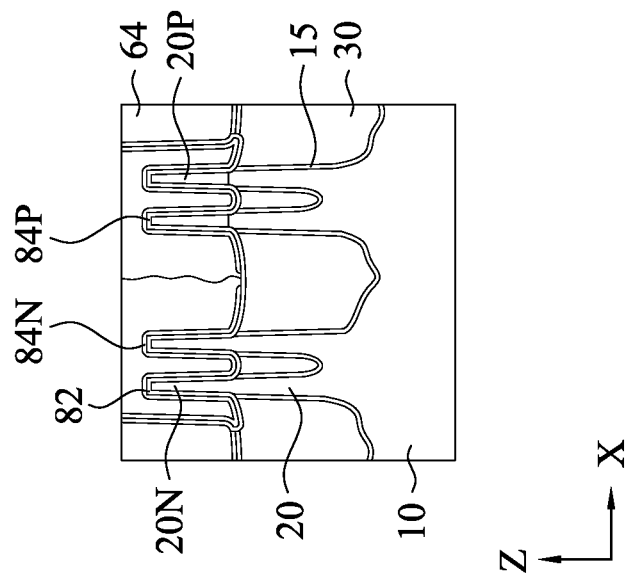
FIGS. 7A, 7B, 7C, 7D and 7E are schematic illustrations of a sequential step of manufacturing a semiconductor device according to an embodiment of the present disclosure.
Figure 7A:
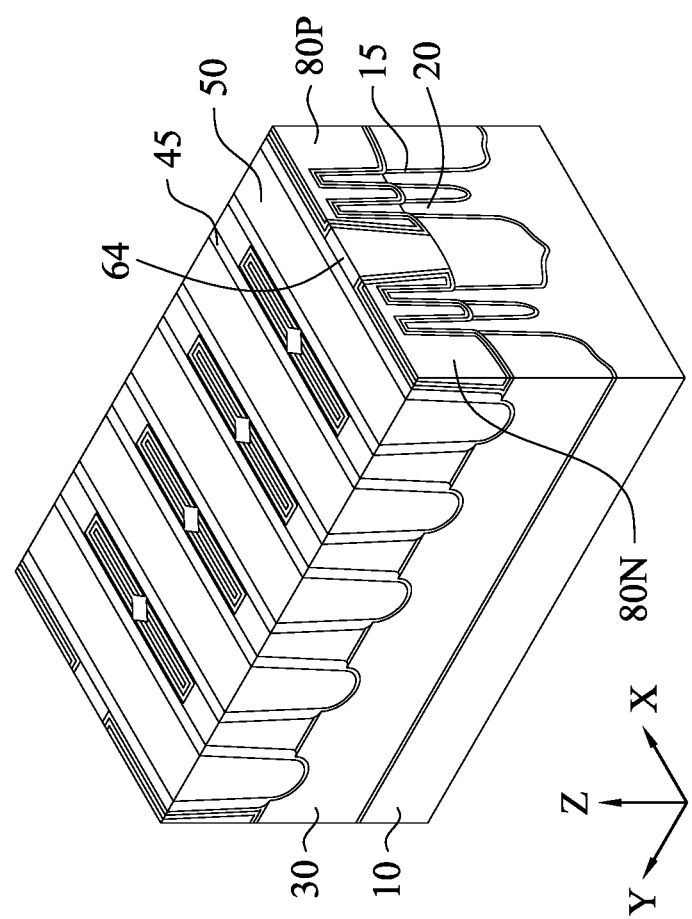
Figure 7C:
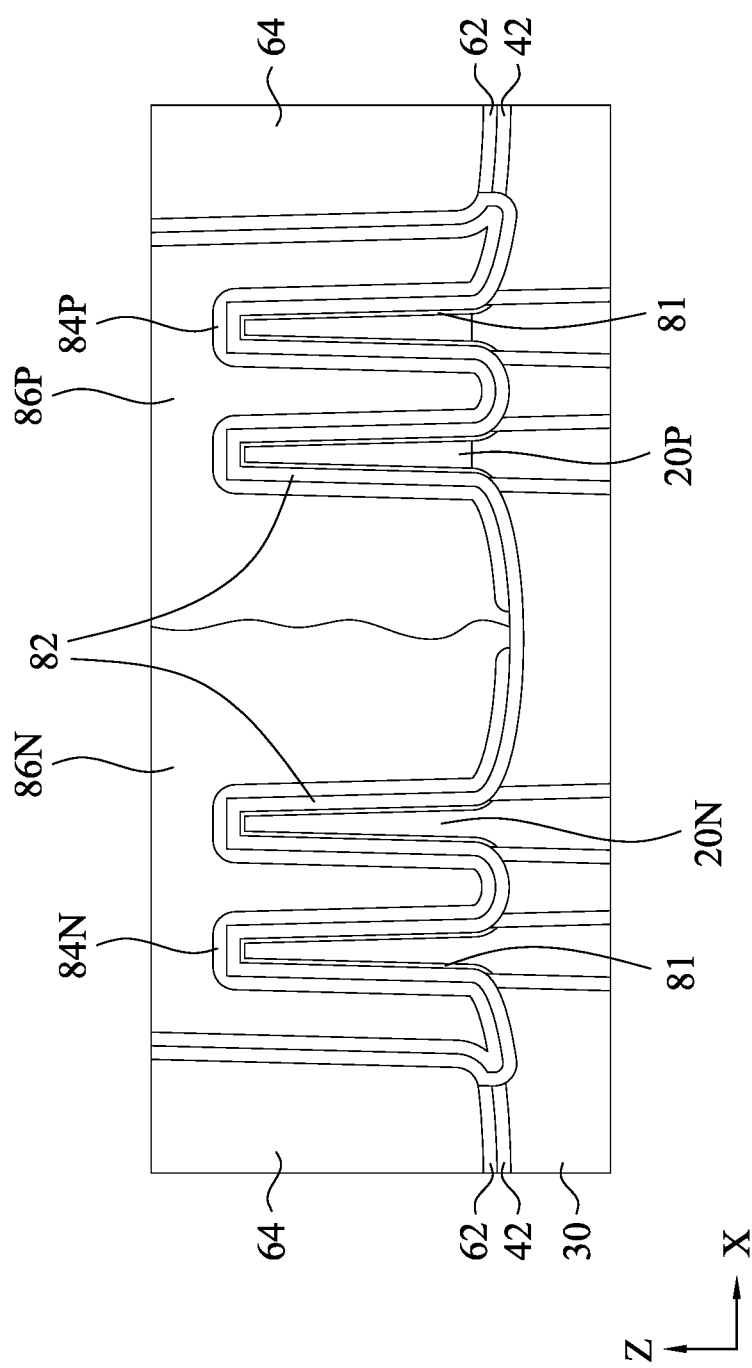
Figure 7E:
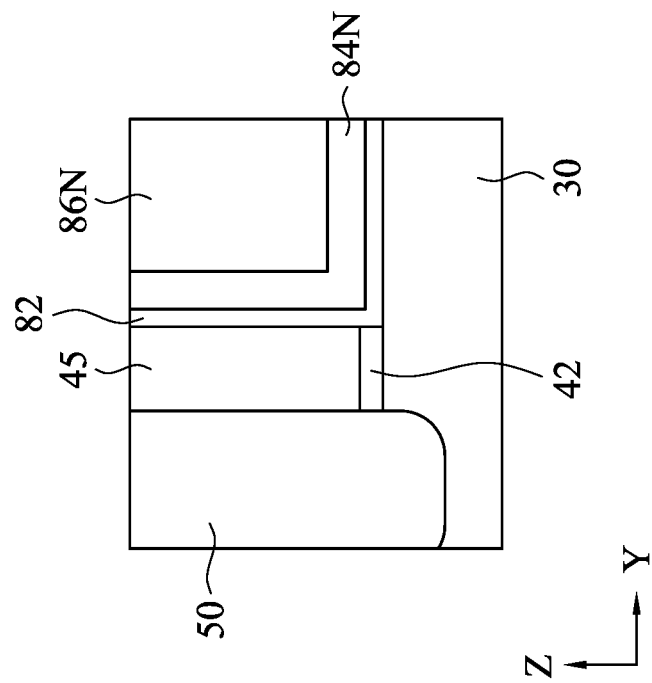
Figure 7D:
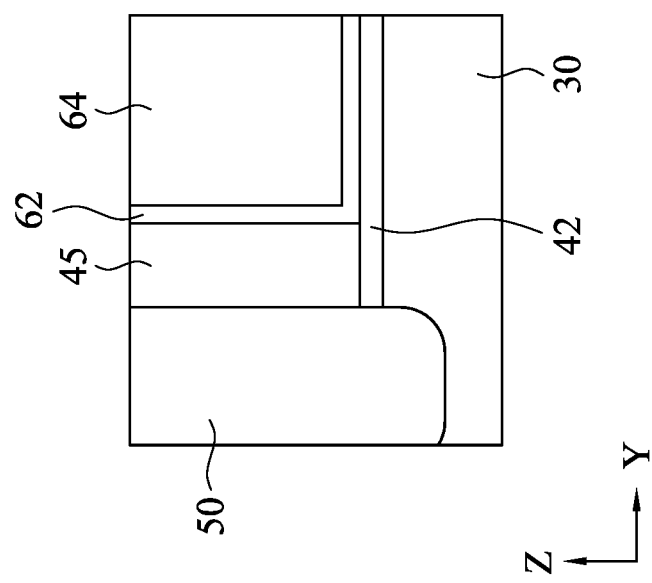

FIGS. 7A-7E are schematic illustrations of a sequential step of manufacturing a semiconductor device according to an embodiment of the present disclosure. FIG. 7A is an isometric view and FIG. 7B is a cross sectional view. FIGS. 7C-7E are detailed cross-sectional views.

After the upper portion of the fin structures 20 are exposed, metal gate structures 80N for n-type FETs and 80P for p-type FETs are formed. In the gate space 65, a gate dielectric layer including an interfacial layer 81 and a high-k gate dielectric layer 82 are formed on the exposed fin structures (channel layers) 20N, 20P as shown in FIGS. 7A-7C. The interfacial layer 81 is a chemically formed silicon oxide in some embodiments. The chemical silicon oxide may be formed using deionized water+ozone ($DIO_3$), $NH_4OH+H_2O_2+H_2O$ (APM), or other methods. The high-k gate dielectric layer 82 includes one or more layers of $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials. The high-k gate dielectric layer 82 may be formed by CVD, ALD or any suitable method. In one embodiment, the high-k gate dielectric layer 82 is formed using a highly conformal deposition process such as ALD in order to ensure the formation of a gate dielectric layer having a uniform thickness around each channel layer. The thickness of the high-k gate dielectric layer 82 is in a range from about 1 nm to about 10 nm in some embodiments. As shown in FIG. 7C, the high-k gate dielectric layer 82 in formed on the upper surface of the isolation insulating layer 30 and a side wall of the second layer 64 of the gate separation plug 60 in some embodiments. In some embodiments, the high-k gate dielectric layer 82 is in contact with the first layer 62 and the sacrificial gate dielectric layer 42 under or at the bottom corner of the second layer 64.

In addition, one or more conductive material layers are formed over the high-k gate dielectric layer 82. In some embodiments, one or more work function adjustment layers 84N, 84P are formed over the gate dielectric layer 82, and a main metal layer 86N, 86P is formed over the work function adjustment layers. In some embodiments, the n-type work function adjustment layer 84N for an n-type FET includes one or more of TaN, TaAlC, TiN, TiC, Co, TiAl, HfTi, TiSi and TaSi is used. In some embodiments, the p-type work function adjustment layer 84P for a p-type FET includes one or more of TiAlC, Al, TiAl, TaN, TaAlC, TiN, TiC and Co. In some embodiments, one or more layers of the n-type work function adjustment layer 84N are also formed over the p-type channel region 20P, and no p-type work function adjustment layer is formed over the n-type channel region 20N. In other embodiments, one or more layers of the p-type work function adjustment layer 84P are also formed over the n-type channel region 20N, and no n-type work function adjustment layer is formed over the p-type channel region 20P.

In some embodiments, the main metal layer 86N, 86P includes a metallic material selected from the group consisting of W, Cu, Ti, Ag, Al, TiAl, TiAlN, TaC, TaCN, TaSiN, Mn, Co, Pd, Ni, Re, Ir, Ru, Pt, and Zr. In some embodiments, the main metal layer includes a metal selected from a group consisting of TiN, WN, TaN, and Ru. Metal alloys such as Ti—Al, Ru—Ta, Ru—Zr, Pt—Ti, Co—Ni and Ni—Ta may be used and/or metal nitrides such as $WN_x$, $TiN_x$, $MoN_x$, $TaN_x$, and $TaSi_xN_y$ may be used. In some embodiments, the main metal layer 86N for an n-type FET and the main metal layer 86P for p-type FET are made of the same material. The work function adjustment layer and the main metal layer may be formed using a suitable process such as atomic layer deposition (ALD), chemical vapor deposition (CVD), physical vapor deposition (PVD), plating, or combinations thereof.

As shown in FIG. 7D cutting the gate separation plug 60 in the Y direction, similar to FIG. 5D, the first layer 62 is formed on the sacrificial gate dielectric layer 42 which extends into the bottom of the gate sidewall spacer 45. In other words, one sacrificial gate dielectric layer 42 is disposed between the gate sidewall 45 and the isolation insulating layer 30 and two sacrificial gate dielectric layers 42 and 62 are disposed between the second layer 64 and the isolation insulating layer 30 (different numbers of dielectric layer(s)). As shown in FIG. 7E cutting the gate electrode in the Y direction, the sacrificial gate dielectric layer 42 is disposed under the gate sidewall spacer 45, and the high-k gate dielectric layer 82 is in contact with the sacrificial gate dielectric layer 42 and the gate sidewall spacer 45 in some embodiments.

Figure 7G:
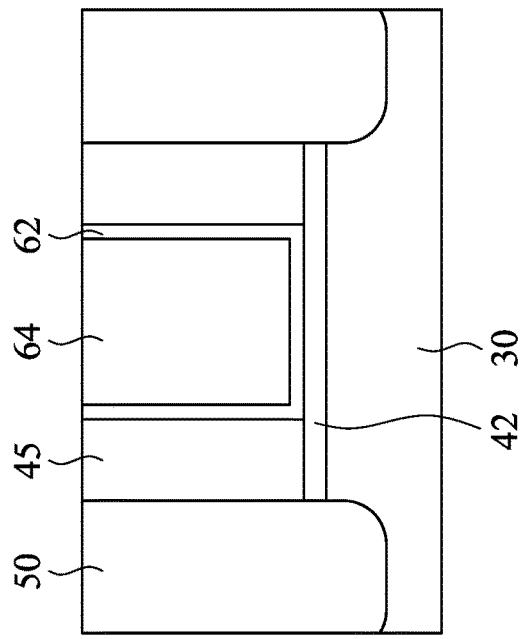
FIGS. 7F, 7G and 7H are detailed cross-sectional views of semiconductor devices according to an embodiment of the present disclosure.
Figure 7F:
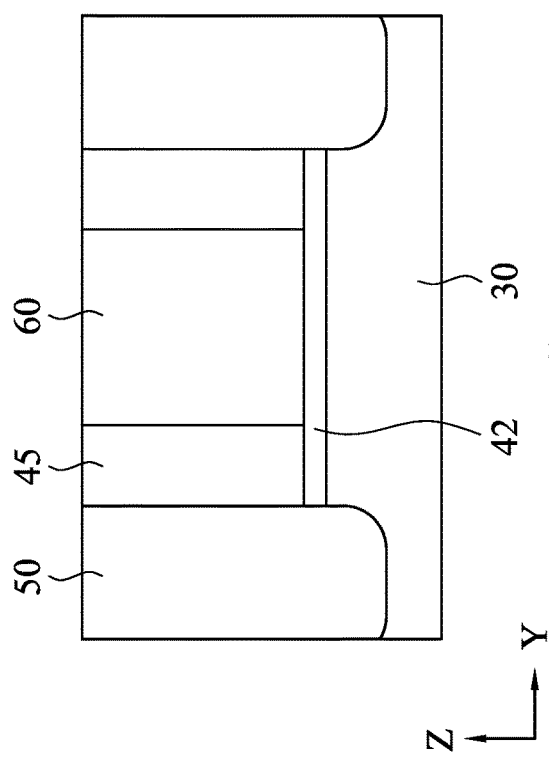
Figure 7H:
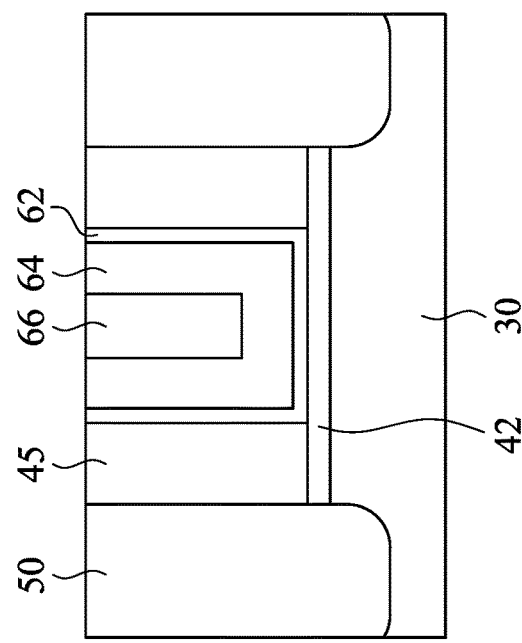

FIGS. 7F-7H show various structures of the gate separation plug. In FIG. 7F, a single dielectric layer is used as the gate separation plug 60. In FIG. 7G, the gate separation plug 60 is made of two layers 62, and 64. In FIG. 7H, the gate separation plug 60 is made of three layers 62, 64 and 66.

After forming the gate electrodes, further CMOS processes are performed to form various features such as additional interlayer dielectric layers, contacts/vias, interconnect metal layers, and passivation layers, etc.

FIGS. 8A-14E show various stages of a sequential manufacturing operation of a semiconductor device according to another embodiment of the present disclosure. It is understood that additional operations can be provided before, during, and after the operations of FIGS. 8A-14E, and some of the operations described below can be replaced or eliminated, for additional embodiments of the method. The order of the operations/processes may be interchangeable. Materials, configurations, dimensions, processes, method and/or operations described with respect to FIGS. 1A-7E may be employed in the following embodiments, and detailed description thereof may be omitted.

Figure 8B:
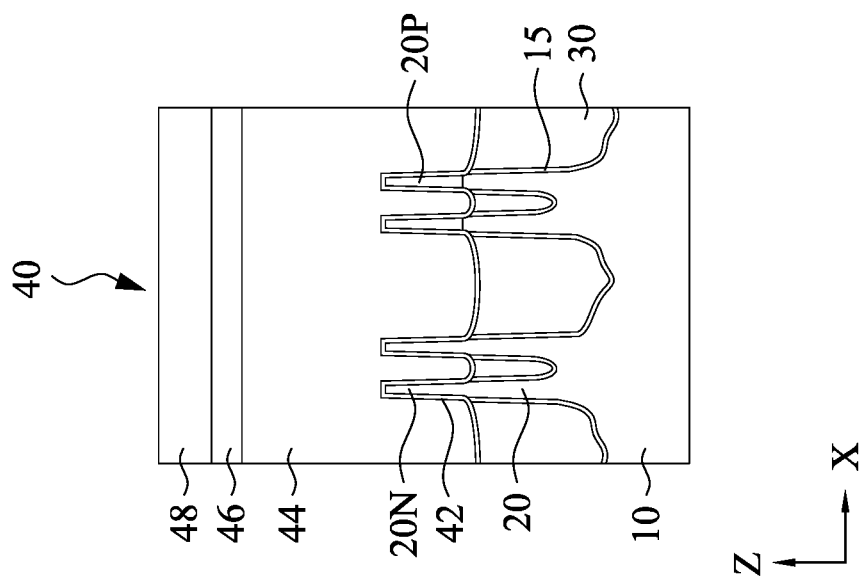
FIGS. 8A and 8B are schematic illustrations of a sequential step of manufacturing a semiconductor device according to another embodiment of the present disclosure.
Figure 8A:
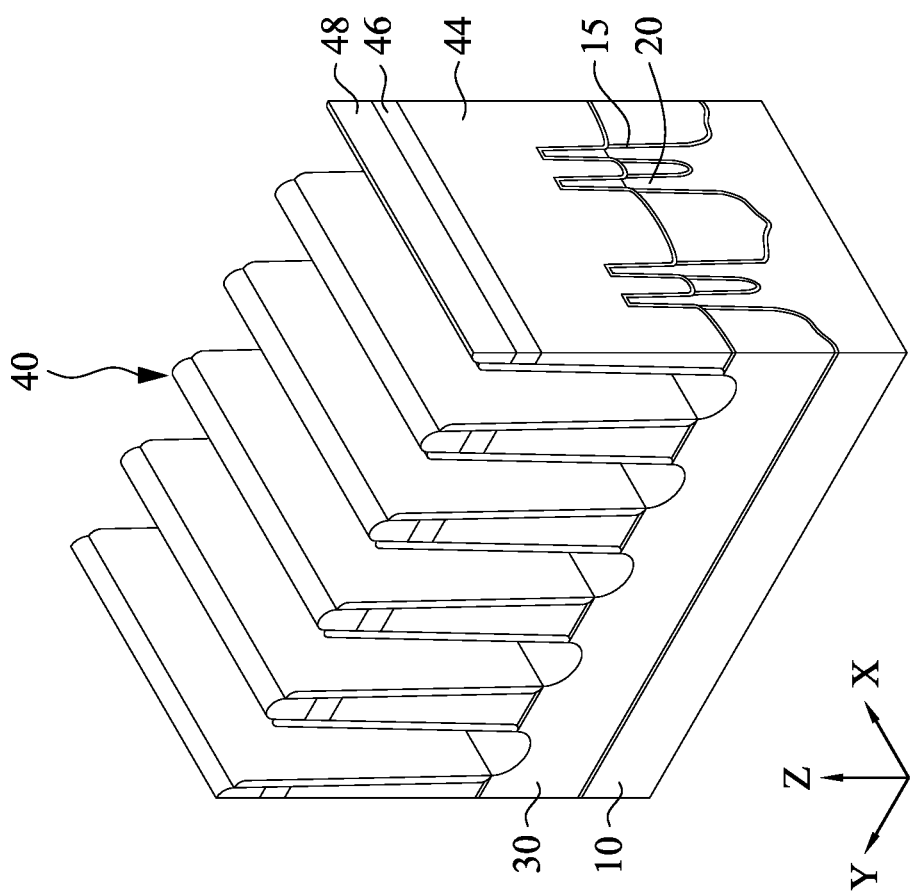
Figure 9B:
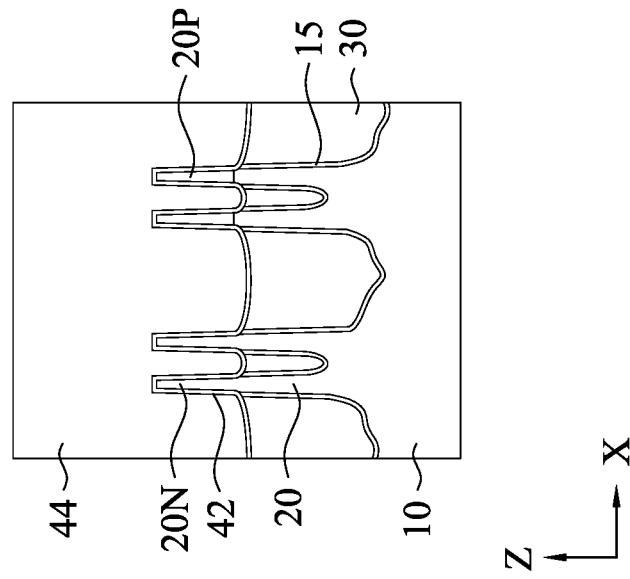
FIGS. 9A and 9B are schematic illustrations of a sequential step of manufacturing a semiconductor device according to another embodiment of the present disclosure.
Figure 9A:
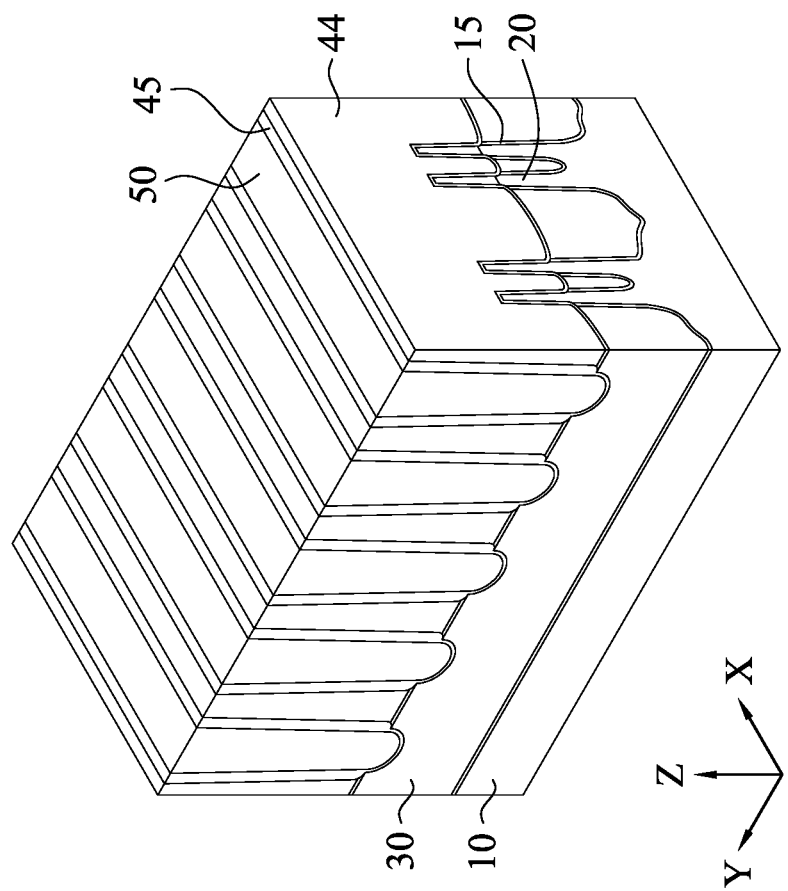

FIGS. 8A and 8B are substantially the same as FIGS. 1A and 1B, and FIGS. 9A and 9B are substantially the same as FIGS. 2A and 2B.

Figure 10B:
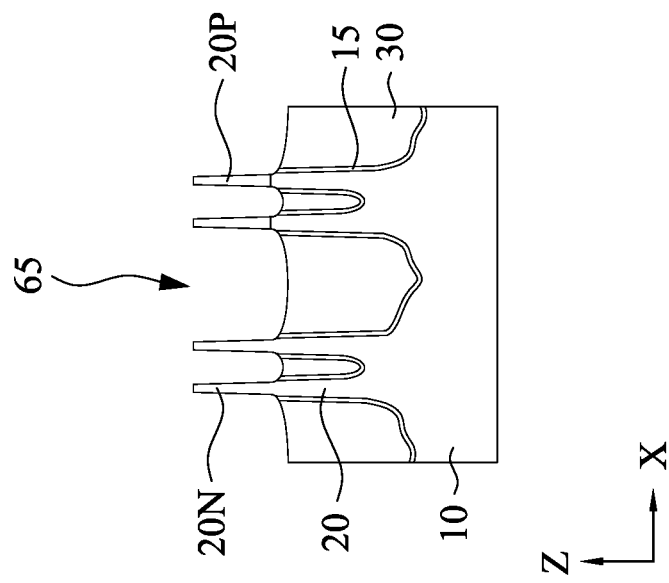
FIGS. 10A and 10B are schematic illustrations of a sequential step of manufacturing a semiconductor device according to another embodiment of the present disclosure.
Figure 10A:
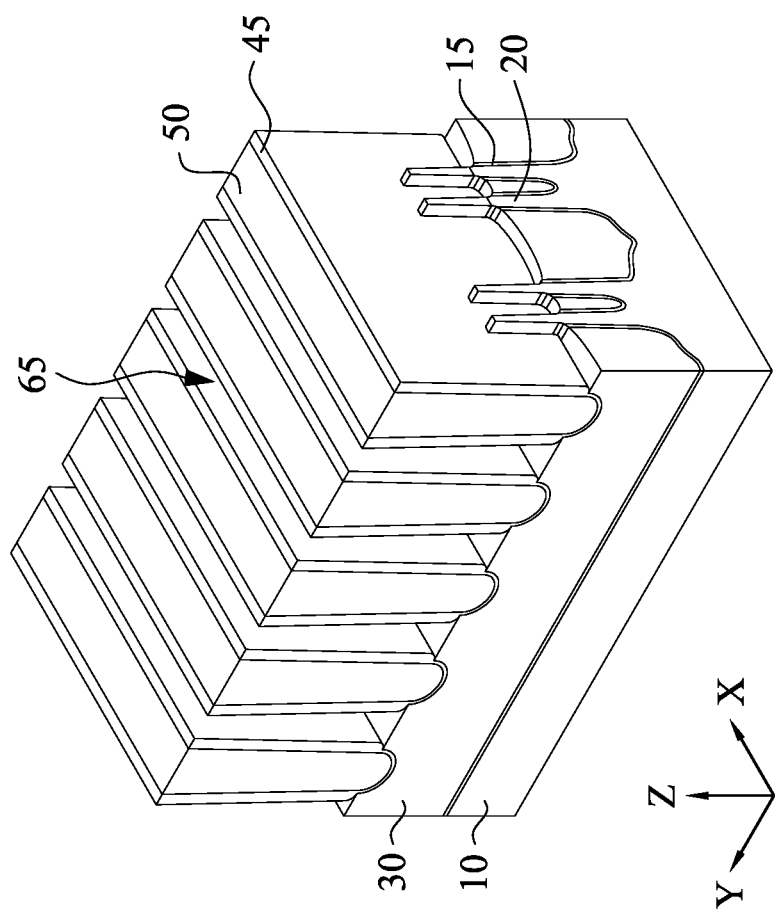

FIGS. 10A and 10B are schematic illustrations of a sequential step of manufacturing a semiconductor device according to another embodiment of the present disclosure. FIG. 10A is an isometric view and FIG. 10B is a cross sectional view.

The sacrificial gate structures 40 are subsequently removed by one or more appropriate etching operations to form gate spaces 65, similar to the operations explained with respect to FIGS. 6A and 6B. As shown in FIGS. 10A and 10B, the upper portions of the fin structures 20N, 20P are exposed in the gate spaces 65.

Figure 11B:
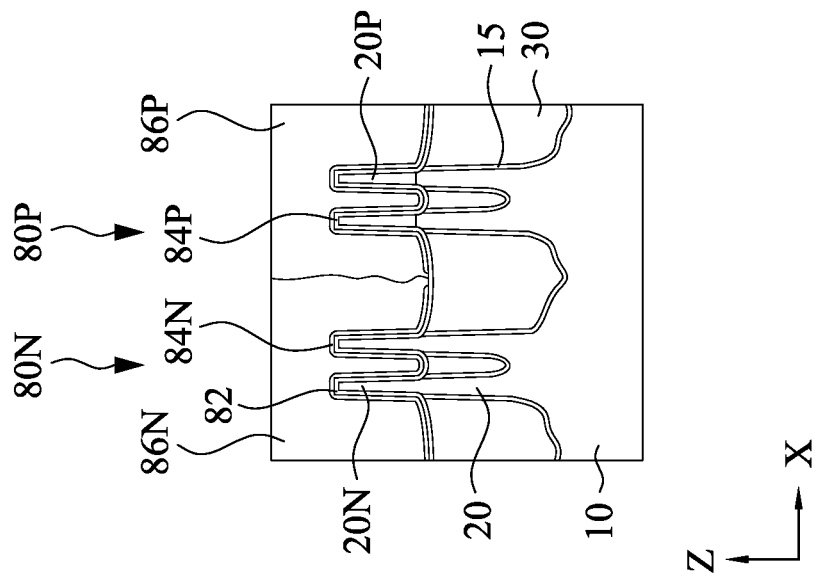
FIGS. 11A and 11B are schematic illustrations of a sequential step of manufacturing a semiconductor device according to another embodiment of the present disclosure.
Figure 11A:
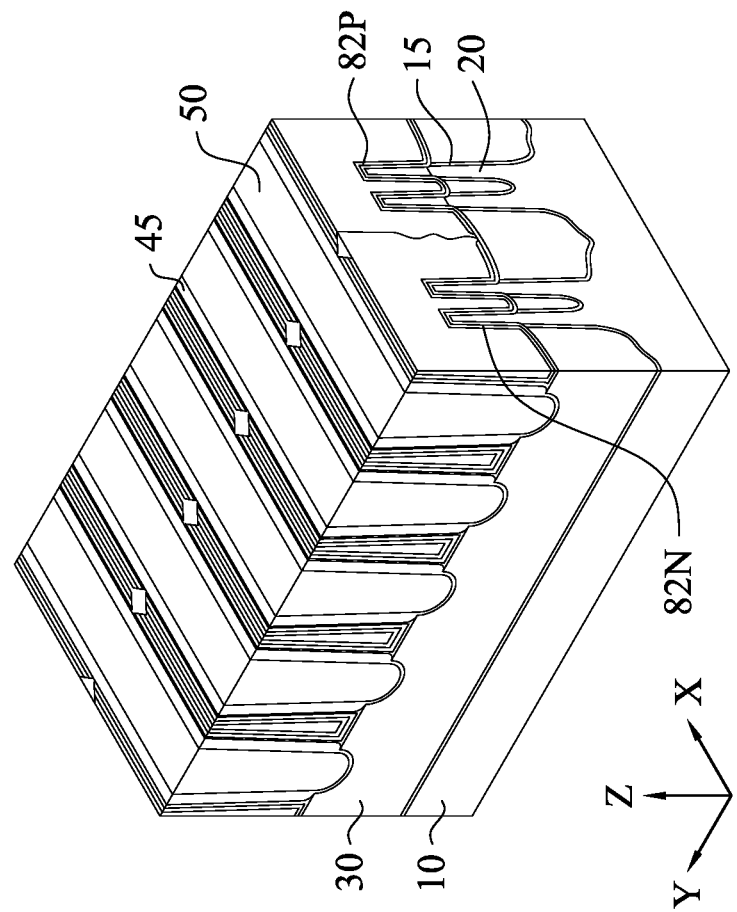

FIGS. 11A and 11B are schematic illustrations of a sequential step of manufacturing a semiconductor device according to another embodiment of the present disclosure. FIG. 11A is an isometric view and FIG. 11B is a cross sectional view.

Similar to the operations explained with respect to FIGS. 7A and 7B, after the upper portion of the fin structures 20 are exposed, in the gate space 65, a gate dielectric layer including an interfacial layer 81 and a high-k gate dielectric layer 82 are formed on the exposed fin structures (channel layers) 20N, 20P. Further, one or more work function adjustment layers 84N, 84P are formed over the gate dielectric layer 82, and a main metal layer 86N, 86P is formed over the work function adjustment layers.

Figure 12B:
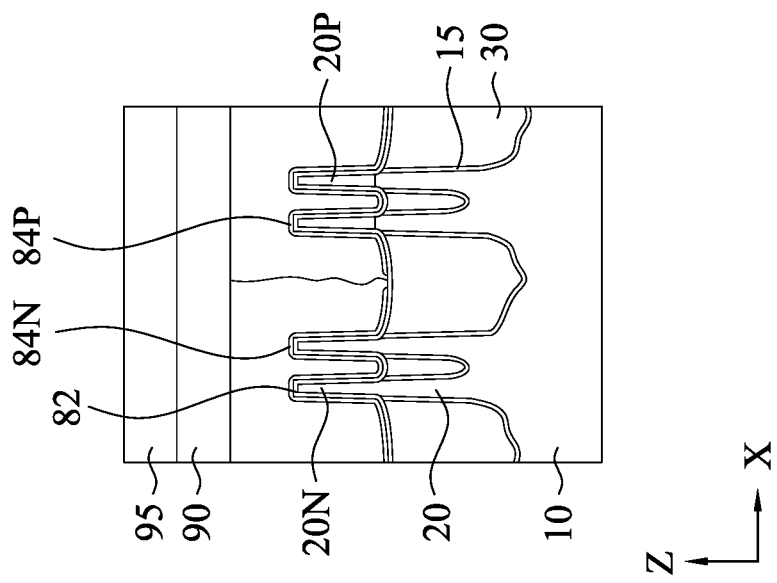
FIGS. 12A and 12B are schematic illustrations of a sequential step of manufacturing a semiconductor device according to another embodiment of the present disclosure.
Figure 12A:
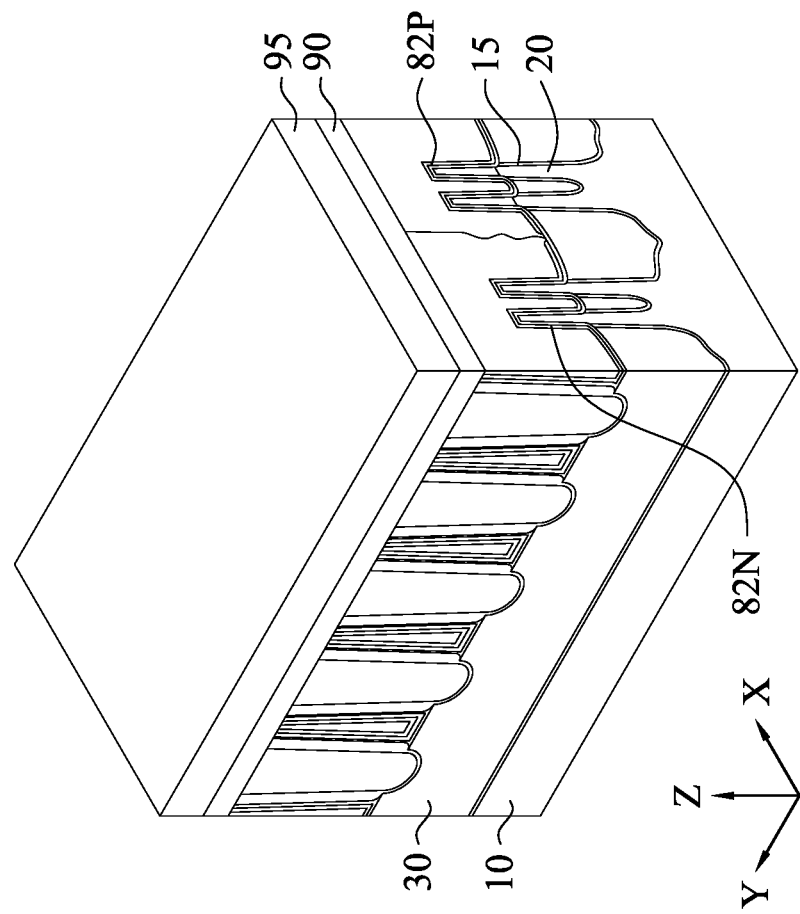

FIGS. 12A and 12B are schematic illustrations of a sequential step of manufacturing a semiconductor device according to another embodiment of the present disclosure. FIG. 12A is an isometric view and FIG. 12B is a cross sectional view.

Similar to the operations explained with respect to FIGS. 3A and 3B, one or more hard mask layers are formed over the gate electrodes 80N, 80P and the first ILD layer 50. In some embodiments, the hard mask layer includes a first hard mask layer 90 and a second hard mask layer 95 made of different materials from each other. In some embodiments, the first hard mask layer 90 is made of silicon oxide and the second hard mask layer 95 is made of silicon nitride or SiON.

Figure 13B:
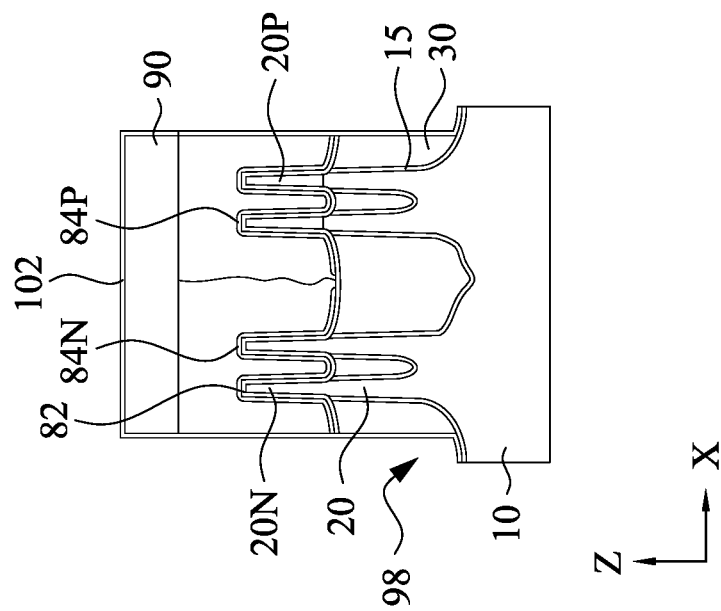
FIGS. 13A and 13B are schematic illustrations of a sequential step of manufacturing a semiconductor device according to another embodiment of the present disclosure.
Figure 13A:
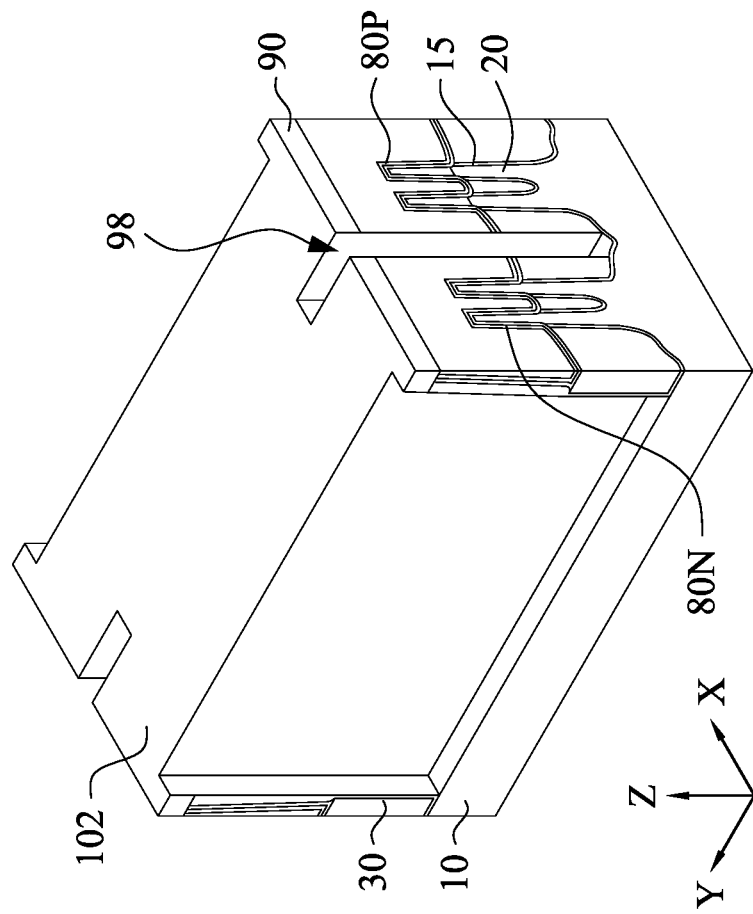

FIGS. 13A and 13B are schematic illustrations of a sequential step of manufacturing a semiconductor device according to an embodiment of the present disclosure. FIG. 13A is an isometric view and FIG. 13B is a cross sectional view cutting the gate electrode.

The metal gate structures extending in the X direction are cut into a plurality pieces of metal gate structures by an end cut process. The end cut process includes one or more lithography and etching operations. By the end cut process, one or more gate end spaces 98 are formed as shown in FIGS. 13A and 13B. In some embodiments, the gate end spaces 98 extend into the isolation insulating layer 30. In some embodiments, the gate spaces 98 reaches the fin liner layer 15. In some embodiments, the fin liner layer 15 remains in the bottom of the gate end space 98. In other embodiments, the fin liner layer 15 is fully removed from the gate end space 98. In other embodiments, part of the isolation insulating layer 30 remains at the bottom of the gate end space 98.

In some embodiments, a photo resist layer having openings there is formed over the hard mask layers. In some embodiments, at least one opening is located over two or more metal gate electrode layers. By using the photo resist layer as an etching mask, the second hard mask layer 95 is patterned and then the first hard mask layer 90 is patterned. After the second hard mask layer 95 is removed, the metal gate electrode layers are patterned by using the patterned first hard mask layer 90.

Further, as shown in FIGS. 13A and 13B, a first layer 102 of a gate separation plug 100 (see, FIGS. 14A and 14B) is conformally formed in the gate space 98 and the top of the first hard mask 90.

Figure 14B:
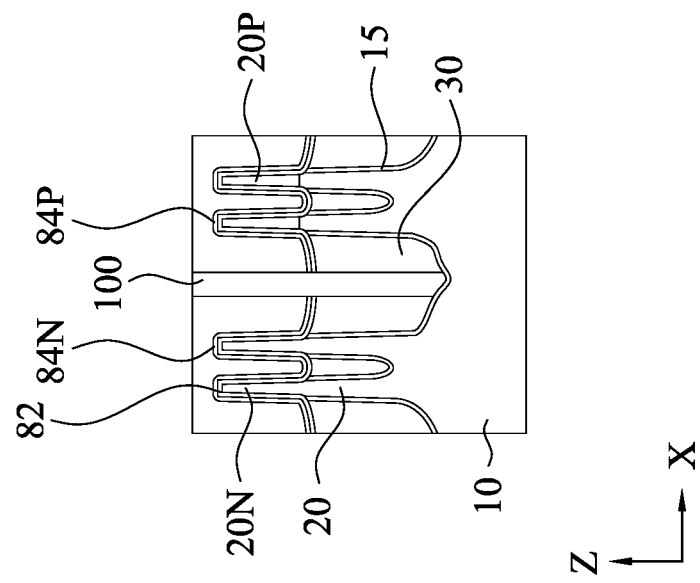
FIGS. 14A, 14B, 14C, 14D, 14E, 14F and 14G are schematic illustrations of a sequential step of manufacturing a semiconductor device according to another embodiment of the present disclosure.
Figure 14A:
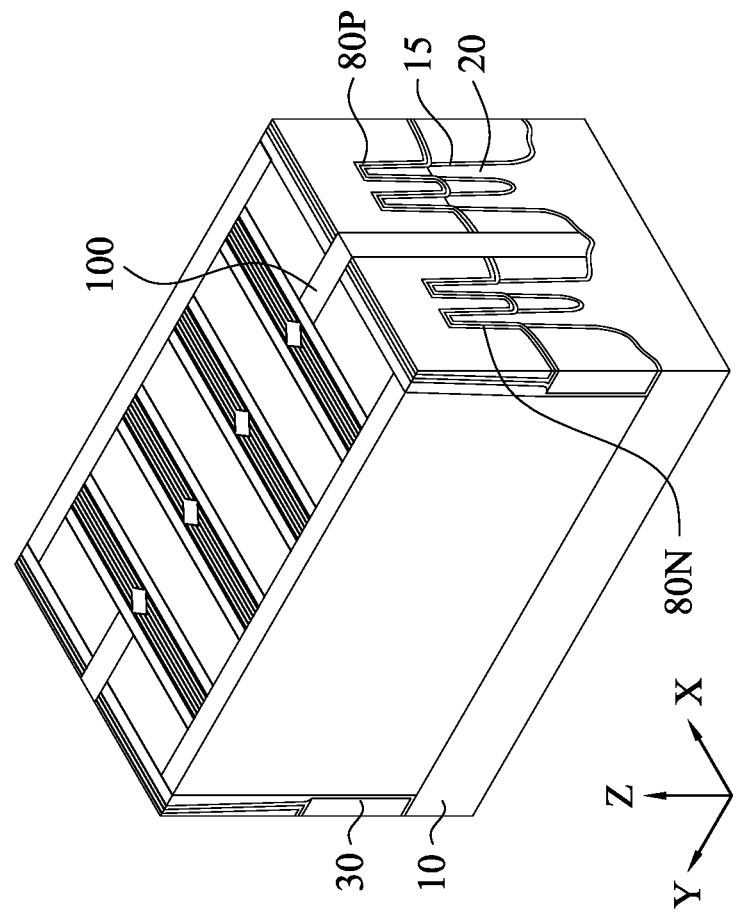
Figure 14D:
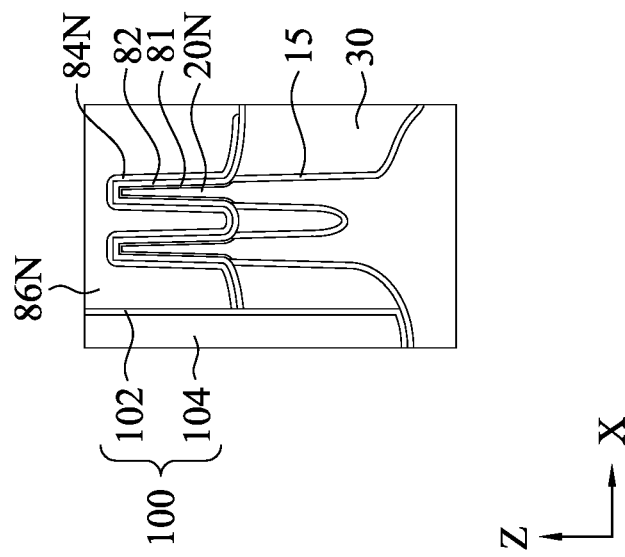
Figure 14C:
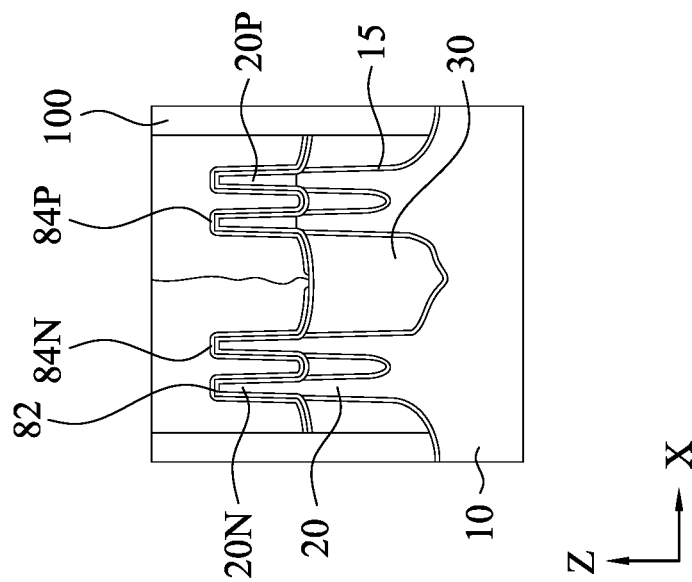
Figure 14E:
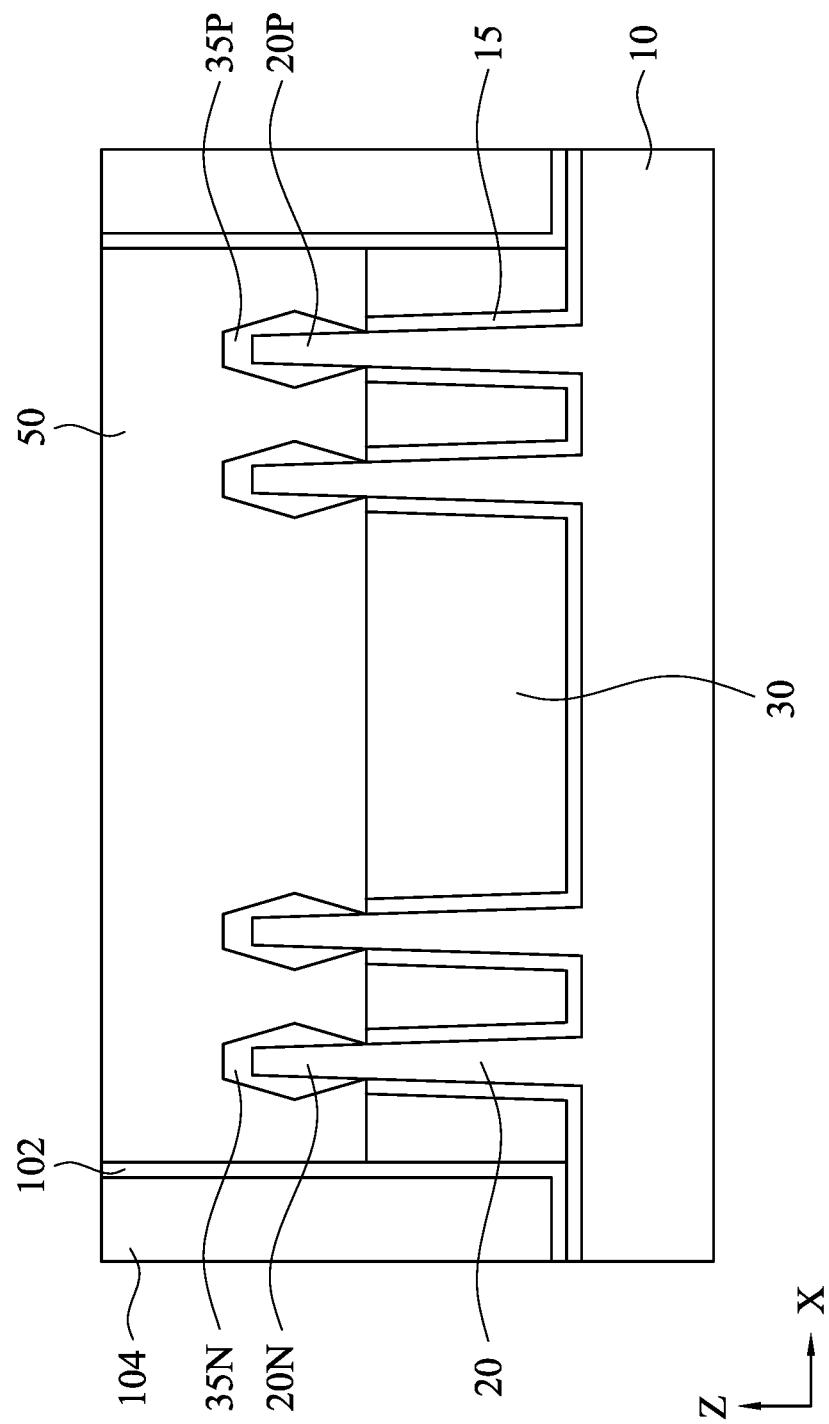

FIGS. 14A-14E are schematic illustrations of a sequential step of manufacturing a semiconductor device according to an embodiment of the present disclosure. FIG. 14A is an isometric view and FIGS. 14B and 14C are cross sectional views cutting the metal gate electrodes. FIG. 14E is a cross sectional view cutting the first ILD layer 50.

After the first layer 102 is formed, one or more dielectric layers for a second layer 104 are formed over the first layer 102, and then a CMP operation is performed to form gate separation plugs 100 as shown in FIGS. 14A-14E. As shown in FIGS. 14A-14E, the gate separation plug 100 extends from the top of the metal gate to the substrate 10. In some embodiments, the gate separation plug 100 is in contact with the fin liner layer 15. In some embodiments, the gate separation plug 100 is in contact with the substrate 10. In other embodiments, the bottom of the gate separation plug 100 is separated from the fin liner layer 15 by a part of the isolation insulating layer 30.

As shown in FIG. 14D, in some embodiments, the body metal layer 86N (86P) is in direct contact with the first layer 102 of the gate separation plug 100. In some embodiments, the first layer 102 is in contact with and disposed between the second layer 104 and the fin liner layer 15. The first layer 102 separates the second layer 104 from the metal gate. As shown in FIG. 14E, the first layer 102 is in contact with the first ILD layer 50. The configuration (e.g., materials) of the gate separation plug 100 (102, 104) is the same as or similar to the gate separation plug 60 (62, 64).

Figure 14G:
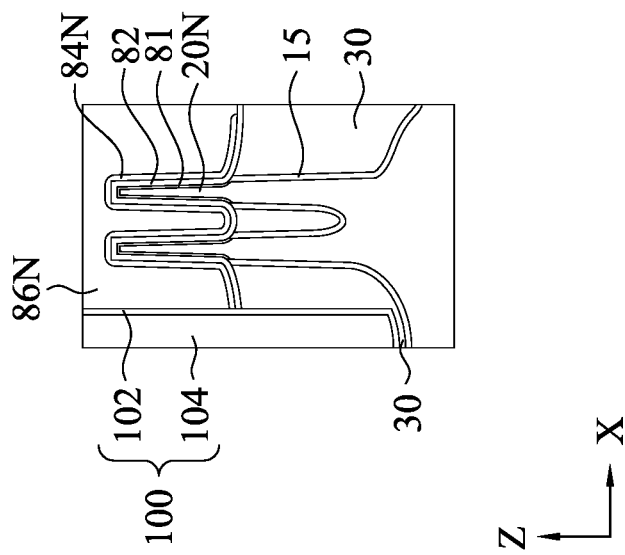
Figure 14F:
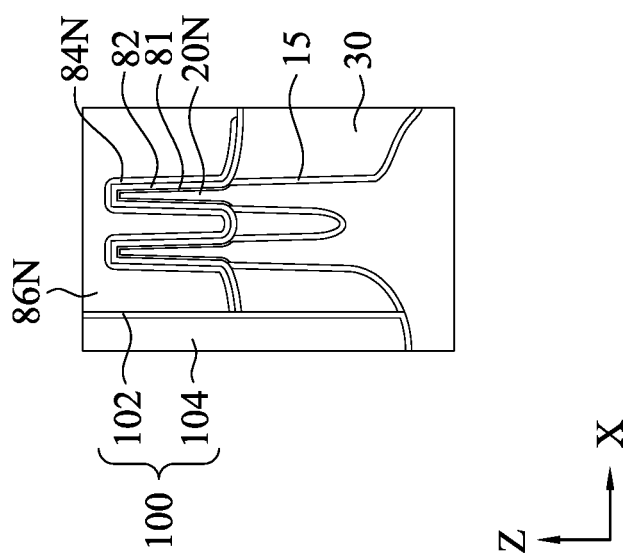

FIGS. 14F and 14G show other configurations of the gate separation plug 100. In some embodiments, the bottom of the gate separation plug 100 (the first layer 102) penetrates the fin liner layer 15 and reaches (is in contact with) the substrate 10, as shown in FIG. 14F. In some embodiments, the gate space 98 is formed such that a part of the isolation insulating layer 30 remains at the bottom of the gate space 98, as shown in FIG. 14G. Thus, the bottom of the gate separation plug 100 (the first layer 102) does not reach the fin liner layer 15 and a part of the isolation insulating layer 30 is disposed between the bottom of the gate separation plug 100 and the fin liner layer 15.

FIGS. 15-18 show various stages of a sequential manufacturing operation of a semiconductor device according to another embodiment of the present disclosure. It is understood that additional operations can be provided before, during, and after the operations of FIGS. 15-18, and some of the operations described below can be replaced or eliminated, for additional embodiments of the method. The order of the operations/processes may be interchangeable. Materials, configurations, dimensions, processes, method and/or operations described with respect to FIGS. 1A-14G may be employed in the following embodiments, and detailed description thereof may be omitted.

Figure 16:
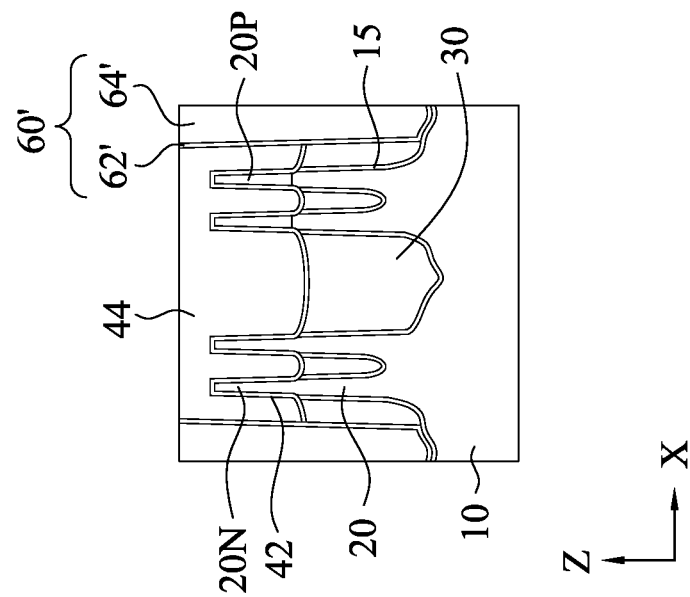
FIGS. 15, 16, 17 and 18 are schematic illustrations of a sequential step of manufacturing a semiconductor device according to another embodiment of the present disclosure.
Figure 15:
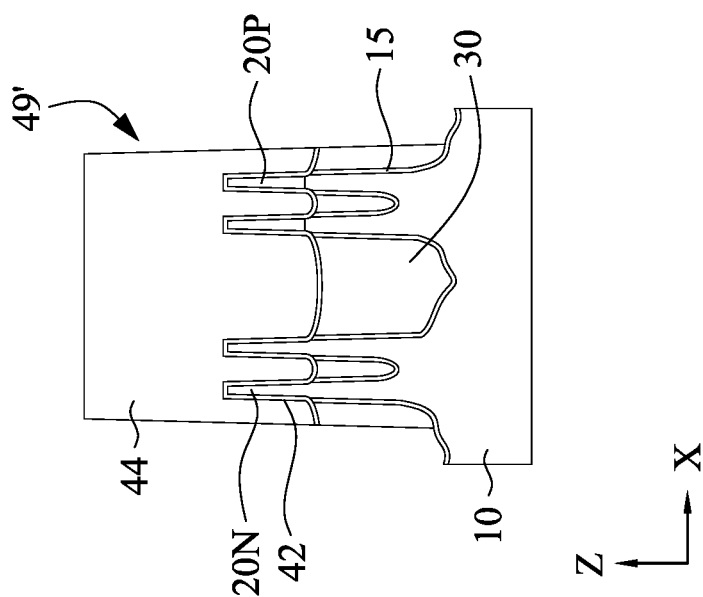

In this embodiment, after the sacrificial gate structures 40 are formed as shown in FIGS. 1A-2B, a gate end space 49' is formed similar to the gate end space 98 to penetrate the isolation insulating layer 30 as shown in FIG. 15. In some embodiments, the gate end space 49' reaches the substrate 10. In other embodiments, the gate end space 49' reaches the fin liner layer 15 but does not reach the substrate 10. In other embodiments, the gate end space 49' does not reach the fin liner layer 15. Then, as shown in FIG. 16, similar to the operations explained with respect to FIGS. 5A-5D, a gate separation plug 60' including a first layer 62' and a second layer 64' are formed. The configuration of the gate separation plug 60' is the same as or similar to the gate separation plugs 60 and/or 100.

Figure 18:
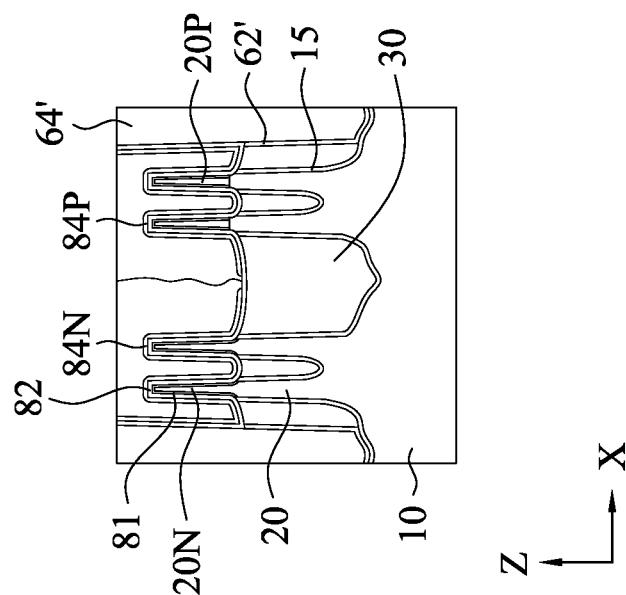
Figure 17:
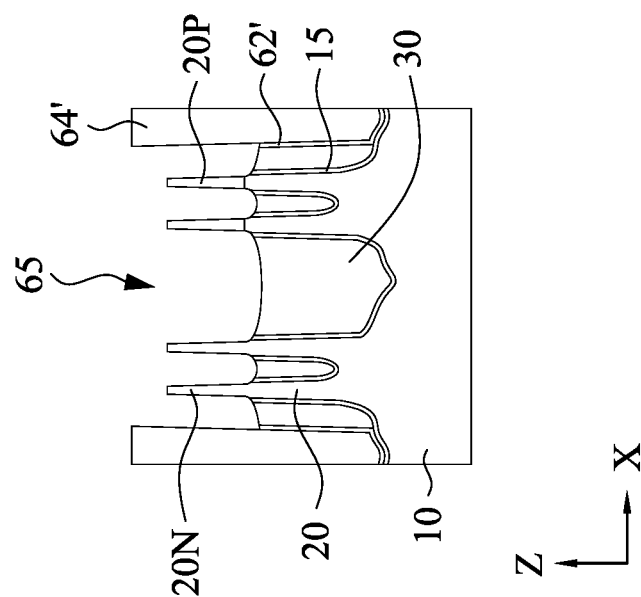

Further, as shown in FIG. 17, similar to the operations explained with respect to FIGS. 6A-6C, the sacrificial gate structures 40 are removed and the first layer 62' is removed. Subsequently, as shown in FIG. 18, similar to the operations explained with respect to FIGS. 7A-7H, metal gate structures are formed. Any of the bottom structures of the separation plug 100 as explained with respect to FIGS. 14D-14G may be applied to the separation plug 60'.

In the present disclosure, because a gate separation plug includes a dielectric material having a lower dielectric constant than silicon oxide, it is possible to suppress parasitic capacitance. Further, by removing a part of the separation plug (first layer), it is possible to increase the size of the gate space, which makes it easier to form metal gate structures in the gate space.

It will be understood that not all advantages have been necessarily discussed herein, no particular advantage is required for all embodiments or examples, and other embodiments or examples may offer different advantages.

In accordance with one aspect of the present disclosure, in a method of manufacturing a semiconductor device, a plurality of fin structures are formed over a semiconductor substrate. The plurality of fin structures extend along a first direction and are arranged in a second direction crossing the first direction. A plurality of sacrificial gate structures extending in the second direction are formed over the fin structures. An interlayer dielectric layer is formed over the plurality of fin structures between adjacent sacrificial gate structures. The sacrificial gate structures are cut into a plurality of pieces of sacrificial gate structures by forming gate end spaces along the second direction. Gate separation plugs are formed by filling the gate end spaces with two or more dielectric materials. The two or more dielectric materials includes a first layer and a second layer formed on the first layer, and a dielectric constant of the second layer is smaller than a dielectric constant of the first layer. In one or more of the foregoing and the following embodiments, after the gate separation plugs are formed, the plurality of pieces of sacrificial gate structures are removed to form gate spaces, the first layer is removed from the gate spaces and after the first layer is removed, metal gate structures are formed in the gate spaces. In one or more of the foregoing and the following embodiments, the first layer is made of silicon oxide. In one or more of the foregoing and the following embodiments, the second layer is one of SiOC, SiOCN, SiCN or a porous material. In one or more of the foregoing and the following embodiments, the metal gate structures are in contact with the second layer. In one or more of the foregoing and the following embodiments, the two or more dielectric materials further includes a third layer having a different dielectric constant than the second layer. In one or more of the foregoing and the following embodiments, the first, second and third layers are, in this order, silicon oxide, SiOCN and silicon oxide; silicon oxide, porous material and silicon oxide; silicon oxide, SiOCN and porous material; or silicon oxide, porous material and SiOCN. In one or more of the foregoing and the following embodiments, each of the plurality of sacrificial gate structures includes a sacrificial gate dielectric layer and a sacrificial gate electrode layer, after the gate end spaces are formed, the sacrificial gate dielectric layer remains at bottom of the gate end spaces, and the first layer is formed on the remaining sacrificial gate dielectric layer. In one or more of the foregoing and the following embodiments, a fin liner layer is formed over the plurality of fin structures and an isolation insulating layer such that upper portions of the plurality of fin structures are exposed. The gate end space penetrates the isolation insulating layer and the gate separation plugs penetrate the isolation insulating layer. In one or more of the foregoing and the following embodiments, the gate separation plugs reach the fin liner layer. In one or more of the foregoing and the following embodiments, the gate separation plugs penetrate the fin liner layer and reach the substrate.

In accordance with another aspect of the present disclosure, in a method of manufacturing a semiconductor device, a first fin structure for an n-type FET and a second fin structure for a p-type FET are formed over a semiconductor substrate. The first and second fin structures extend along a first direction and are arranged in a second direction crossing the first direction. A sacrificial gate structure extending in the second direction is over the first and second fin structures. Gate sidewall spacers are formed on opposing side faces of the sacrificial gate structure. A first epitaxial layer is formed over a source/drain region of the first fin structure and forming a second epitaxial layer is formed over a source/drain region of the second fin structure. An interlayer dielectric layer is formed over the first and second epitaxial layers. An gate end space is formed by cutting the sacrificial gate structures into a first sacrificial gate structure over the first fin structure and a second sacrificial gate structure over the second fin structure. A gate separation plug is formed by filling the gate end space with two or more dielectric materials. The two or more dielectric materials includes a first layer and a second layer formed on the first layer. The first and second sacrificial gate structures are removed to form first and second gate spaces separated by the gate separation plug. The first layer is removed from the first and second gate spaces. After the first layer is removed, a first metal gate structure is formed in the first gate space and a second metal gate structure is formed in the second gate space. In one or more of the foregoing and the following embodiments, the first layer is made of silicon oxide, and the second layer includes one or more layer of SiOC, SiOCN, SiCN or a porous material. In one or more of the foregoing and the following embodiments, the sacrificial gate structure includes a sacrificial gate dielectric layer and a sacrificial gate electrode layer, after the gate end space is formed, the sacrificial gate dielectric layer remains at bottom of the gate end space, and the first layer is formed on the remaining sacrificial gate dielectric layer. In one or more of the foregoing and the following embodiments, the first layer is made of a same material as the sacrificial gate dielectric layer. In one or more of the foregoing and the following embodiments, the first layer is removed when the sacrificial gate dielectric layer is removed in the removing the first and second sacrificial gate structures. In one or more of the foregoing and the following embodiments, when the first layer is removed, a part of the first layer and a part of the sacrificial gate dielectric layer disposed under the second layer are laterally recessed. In one or more of the foregoing and the following embodiments, a fin liner layer is formed over the first and second fin structures and an isolation insulating layer such that upper portions of the first and second fin structures are exposed. The gate end space penetrates the isolation insulating layer and the gate separation plug penetrates the isolation insulating layer. In one or more of the foregoing and the following embodiments, the gate separation plug reaches the fin liner layer. In one or more of the foregoing and the following embodiments, the gate separation plug penetrates the fin liner layer and reaches the substrate.

In accordance with another aspect of the present disclosure, in a method of manufacturing a semiconductor device, a plurality of fin structures are formed over a semiconductor substrate. The plurality of fin structures extend along a first direction and are arranged in a second direction crossing the first direction. A plurality of sacrificial gate structures extending in the second direction are formed over the fin structures. An interlayer dielectric layer is formed over the plurality of fin structures between adjacent sacrificial gate structures. The plurality of sacrificial gate structures are removed to form gate spaces. Metal gate structures are formed in the gate spaces. The metal gate structures are cut into a plurality of pieces of metal gate structures by forming gate end spaces along the second direction. Gate separation plugs are formed by filling the gate end spaces with two or more dielectric materials. The two or more dielectric materials includes a first layer and a second layer formed on the first layer, and a dielectric constant of the second layer is smaller than a dielectric constant of the first layer. In one or more of the foregoing and the following embodiments, a fin liner layer is formed over the plurality of fin structures, and an isolation insulating layer is formed such that upper portions of the fin structures are exposed. The gate end spaces penetrate the isolation insulating layer. In one or more of the foregoing and the following embodiments, the gate end spaces reach the fin liner layer. In one or more of the foregoing and the following embodiments, the gate end spaces penetrate the fin liner layer and reach the substrate. In one or more of the foregoing and the following embodiments, the first layer is made of silicon oxide, and the second layer includes one or more layer of SiOC, SiOCN, SiCN or a porous material. In one or more of the foregoing and the following embodiments, a thickness of the first layer is smaller than a thickness of the second layer.

In accordance with one aspect of the present disclosure, a semiconductor device includes a first fin field-effect transistor (Fin FET) and a second Fin FET. The first Fin FET includes a first fin structure extending in a first direction and a first gate structure. The first gate structure includes a first gate dielectric layer formed over the first fin structure and a first gate electrode layer formed over the first gate dielectric layer, and extends in a second direction perpendicular to the first direction. The second Fin FET includes a second fin structure extending in the first direction and a second gate structure. The second gate structure includes a second gate dielectric layer formed over the second fin structure and a second gate electrode layer formed over the second gate dielectric layer and extends in the second direction. The semiconductor device further includes sidewall spacers extending in the second direction, between which the first and second gate structures are disposed. The first gate structure and the second gate structure are aligned along the second direction and are separated by a separation plug made of an insulating material, the separation plug includes a first layer and a second layer formed on the first layer, and a dielectric constant of the second layer is smaller than a dielectric constant of the first layer. In one or more of the foregoing and the following embodiments, the first layer is made of silicon oxide. In one or more of the foregoing and the following embodiments, the second layer is one of SiOC, SiOCN, SiCN or a porous material. In one or more of the foregoing and the following embodiments, the first and second gate structures are in direct contact with the second layer. In one or more of the foregoing and the following embodiments, the separation plug further includes a third layer having a different dielectric constant than the second layer on the second layer. In one or more of the foregoing and the following embodiments, the first, second and third layers are, in this order: silicon oxide, SiOCN and silicon oxide; silicon oxide, porous material and silicon oxide; silicon oxide, SiOCN and porous material; or silicon oxide, porous material and SiOCN. In one or more of the foregoing and the following embodiments, an additional insulating material layer is continuously disposed under one of the sidewall spacers and under the first layer. In one or more of the foregoing and the following embodiments, the additional insulating material layer is made of a same material as the first layer. In one or more of the foregoing and the following embodiments, the additional insulating material layer is made of a different material than the first layer. In one or more of the foregoing and the following embodiments, the semiconductor device includes a fin liner layer formed over the first and second fin structures and an isolation insulating layer formed such that upper portions of the first and second fin structures are exposed. The gate separation plug penetrates the isolation insulating layer. In one or more of the foregoing and the following embodiments, the gate separation plug reaches the fin liner layer. In one or more of the foregoing and the following embodiments, the gate separation plug penetrates the fin liner layer and reaches the substrate.

In accordance with another aspect of the present disclosure, a semiconductor device includes an isolation insulating layer disposed over a substrate, a first gate structure and a second gate structure. The first gate structure is disposed over one or more fin structures protruding, includes a first gate dielectric layer and a first gate electrode layer formed over the first gate dielectric layer and extends in a first direction. The second gate structure is disposed over one or more fin structures, includes a second gate dielectric layer and a second gate electrode layer formed over the second gate dielectric layer and extends in the first direction. The semiconductor device further includes sidewall spacers extending in the second direction, between which the first and second gate structures are disposed. The one or more fin structures of the first and second gate structures have upper portions protruding from the isolation insulating layer and lower portions embedded in the isolation insulating layer, the first gate structure and the second gate structure are aligned along the second direction and are separated by a separation plug made of an insulating material, and the separation plug penetrates the isolation insulating layer. In one or more of the foregoing and the following embodiments, the separation plug reaches the substrate. In one or more of the foregoing and the following embodiments, a fin liner layer is disposed on the lower portions of the one or more fin structures, and the separation plug reaches the fin liner layer. In one or more of the foregoing and the following embodiments, a fin liner layer is disposed on the lower portions of the one or more fin structures, and a part of the isolation insulating layer is disposed between a bottom of the separation plug and the fin liner layer. In one or more of the foregoing and the following embodiments, the separation plug includes a first layer and a second layer formed on the first layer, and a dielectric constant of the second layer is smaller than a dielectric constant of the first layer. In one or more of the foregoing and the following embodiments, the first gate electrode layer is in contact with the first layer. In one or more of the foregoing and the following embodiments, the first layer is made of silicon oxide. In one or more of the foregoing and the following embodiments, the second layer is one of SiOC, SiOCN, SiCN or a porous material. In one or more of the foregoing and the following embodiments, the gate separation plug penetrates the isolation insulating layer. In one or more of the foregoing and the following embodiments, the gate separation plug reaches the fin liner layer. In one or more of the foregoing and the following embodiments, the gate separation plug penetrates the fin liner layer and reaches the substrate.

In accordance with another aspect of the present disclosure, a semiconductor device includes an isolation insulating layer disposed over a substrate, a first fin structure for an n-type FET and a second fin structure for a p-type FET. The first and second fin structures extend along a first direction and are arranged in a second direction crossing the first direction. The semiconductor device further includes a first metal gate structure extending in the second direction over the first fin structure and a second metal gate structure extending in the second direction over the second fin structure, and disposed adjacent to the first metal gate structure in the second direction, gate sidewall spacers continuously disposed on opposing side faces of the first and second metal gate structures; a first epitaxial layer disposed over a source/drain region of the first fin structure and a second epitaxial layer disposed over a source/drain region of the second fin structure, an interlayer dielectric layer over the first and second epitaxial layers, and a gate separation plug disposed between the first and second gate structures. The separation plug includes a first layer and a second layer formed on the first layer, a dielectric constant of the second layer is smaller than a dielectric constant of the first layer, and a thickness of the first layer is smaller than a thickness of the second layer. In one or more of the foregoing and the following embodiments, a bottom of the gate separation plug is located over an upper surface of the isolation insulating layer. In one or more of the foregoing and the following embodiments, the gate separation plug penetrates into the isolation insulating layer.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
 a first fin field-effect transistor (Fin FET) including a first fin structure extending in a first direction and a first gate structure, the first gate structure including a first gate dielectric layer formed over the first fin structure and a first gate electrode layer formed over the first gate dielectric layer and extending in a second direction perpendicular to the first direction;
a second Fin FET including a second fin structure extending in the first direction and a second gate structure, the second gate structure including a second gate dielectric layer formed over the second fin structure and a second gate electrode layer formed over the second gate dielectric layer and extending in the second direction; and
sidewall spacers extending in the second direction, between which the first and second gate structures are disposed, wherein:
the first gate structure and the second gate structure are aligned along the second direction and are separated by a separation plug made of an insulating material,
the separation plug includes a first layer and a second layer formed on the first layer, and
a dielectric constant of the second layer is smaller than a dielectric constant of the first layer.

2. The semiconductor device of claim 1, wherein the first layer is made of silicon oxide.

3. The semiconductor device of claim 2, wherein the second layer is one of SiOC, SiOCN, SiCN or a porous material.

4. The semiconductor device of claim 2, wherein the first and second gate structures are in direct contact with the second layer.

5. The semiconductor device of claim 1, wherein the separation plug further includes a third layer having a different dielectric constant than the second layer on the second layer.

6. The semiconductor device of claim 5, wherein the first, second and third layers are, in this order:
silicon oxide, SiOCN and silicon oxide;
silicon oxide, porous material and silicon oxide;
silicon oxide, SiOCN and porous material; or
silicon oxide, porous material and SiOCN.

7. The semiconductor device of claim 1, wherein an additional insulating material layer is continuously disposed under one of the sidewall spacers and under the first layer.

8. The semiconductor device of claim 7, wherein the additional insulating material layer is made of a same material as the first layer.

9. The semiconductor device of claim 7, wherein the additional insulating material layer is made of a different material than the first layer.

10. A semiconductor device, comprising:
an isolation insulating layer disposed over a substrate;
a first gate structure disposed over one or more fin structures protruding, the first gate structure including a first gate dielectric layer and a first gate electrode layer formed over the first gate dielectric layer and extending in a first direction;
a second gate structure disposed over one or more fin structures, the second gate structure including a second gate dielectric layer and a second gate electrode layer formed over the second gate dielectric layer and extending in the first direction; and
sidewall spacers extending in the second direction, between which the first and second gate structures are disposed, wherein:
the one or more fin structures of the first and second gate structures have upper portions protruding from the isolation insulating layer and lower portions embedded in the isolation insulating layer,
the first gate structure and the second gate structure are aligned along the second direction and are separated by a separation plug made of an insulating material, and
the separation plug penetrates the isolation insulating layer.

11. The semiconductor device of claim 10, wherein the separation plug reaches the substrate.

12. The semiconductor device of claim 10, wherein:
a fin liner layer is disposed on the lower portions of the one or more fin structures, and
the separation plug reaches the fin liner layer.

13. The semiconductor device of claim 10, wherein:
a fin liner layer is disposed on the lower portions of the one or more fin structures, and
a part of the isolation insulating layer is disposed between a bottom of the separation plug and the fin liner layer.

14. The semiconductor device of claim 10, wherein:
the separation plug includes a first layer and a second layer formed on the first layer, and
a dielectric constant of the second layer is smaller than a dielectric constant of the first layer.

15. The semiconductor device of claim 14, wherein the first gate electrode layer is in contact with the first layer.

16. The semiconductor device of claim 14, wherein the first layer is made of silicon oxide.

17. The semiconductor device of claim 16, wherein the second layer is one of SiOC, SiOCN, SiCN or a porous material.

18. A semiconductor device, comprising:
an isolation insulating layer disposed over a substrate;
a first fin structure for an n-type FET and a second fin structure for a p-type FET, the first and second fin structures extending along a first direction and arranged in a second direction crossing the first direction;
a first metal gate structure extending in the second direction over the first fin structure and a second metal gate structure extending in the second direction over the second fin structure, and disposed adjacent to the first metal gate structure in the second direction;
gate sidewall spacers continuously disposed on opposing side faces of the first and second metal gate structures;
a first epitaxial layer disposed over a source/drain region of the first fin structure and a second epitaxial layer disposed over a source/drain region of the second fin structure;
an interlayer dielectric layer over the first and second epitaxial layers; and
a gate separation plug disposed between the first and second gate structures, wherein:
the separation plug includes a first layer and a second layer formed on the first layer,
a dielectric constant of the second layer is smaller than a dielectric constant of the first layer, and
a thickness of the first layer is smaller than a thickness of the second layer.

19. The semiconductor device of claim 18, wherein a bottom of the gate separation plug is located over an upper surface of the isolation insulating layer.

20. The semiconductor device of claim 18, wherein the gate separation plug penetrates into the isolation insulating layer.

* * * * *